United States Patent
Rezazadehreyhani et al.

(10) Patent No.: US 10,819,468 B2
(45) Date of Patent: Oct. 27, 2020

(54) STOCHASTIC LINEAR DETECTION

(71) Applicant: BLACK LATTICE TECHNOLOGIES, INC., Salt Lake City, UT (US)

(72) Inventors: Ahmad Rezazadehreyhani, San Jose, CA (US); Jonathan C. Hedstrom, Salt Lake City, UT (US); Chung Him Yuen, Salt Lake City, UT (US); Kohl Riekhof, Cottonwood Heights, UT (US); Daryl Wasden, Draper, UT (US); Behrouz Farhang, Salt Lake City, UT (US)

( * ) Notice: Subject to any disclaimer, the term of this patent is extended or adjusted under 35 U.S.C. 154(b) by 0 days.

(21) Appl. No.: 16/705,206

(22) Filed: Dec. 5, 2019

(65) Prior Publication Data

US 2020/0186277 A1 Jun. 11, 2020

Related U.S. Application Data

(60) Provisional application No. 62/775,652, filed on Dec. 5, 2018.

(51) Int. Cl.
*H03D 1/00* (2006.01)
*H04L 1/00* (2006.01)
(Continued)

(52) U.S. Cl.
CPC ......... *H04L 1/005* (2013.01); *H03M 13/1125* (2013.01); *H04B 7/0413* (2013.01);
(Continued)

(58) Field of Classification Search
CPC ..... H04L 1/005; H04L 1/0054; H04L 1/0631; H04L 25/067; H03M 13/1125; H04B 7/0413
(Continued)

(56) References Cited

U.S. PATENT DOCUMENTS 7,480,340 B2 1/2009 Andrieu
8,767,657 B1 7/2014 Dehghan et al.
(Continued)

FOREIGN PATENT DOCUMENTS

WO 2016001066 A 1/2016
WO 2017004546 A1 1/2017

OTHER PUBLICATIONS

International Application No. PCT/US2019/64797, Notification of the International Search Report an the Written Opinion of the International Searching Authority, dated Feb. 21, 2020, pp. 1-13.

*Primary Examiner* — Zewdu A Kassa
(74) *Attorney, Agent, or Firm* — Kunzler Bean & Adamson, PC

(57) ABSTRACT

Apparatuses, systems, and methods are disclosed for stochastic linear detection. A digital signal processor determines information about a plurality of transmitted signals based on a plurality of received signals. An initialization module determines an estimator matrix and a noise shaping matrix based on channel state information that relates the transmitted signals to the received signals. A sample generation module stochastically generates a plurality of signal estimates so that each signal estimate is a sum of a fixed component and a random component. The fixed component may be based on applying the estimator matrix to a vector of the received signals, and the random component may be based on applying the noise shaping matrix to generated noise. An output module sends soft information to an error-correcting code (ECC) decoder for decoding bits carried by the transmitted signals. The soft information may be based on the plurality of signal estimates.

20 Claims, 7 Drawing Sheets

(51) Int. Cl.
*H04L 25/06* (2006.01)
*H04B 7/0413* (2017.01)
*H03M 13/11* (2006.01)
*H04L 1/06* (2006.01)
*H04L 25/03* (2006.01)

(52) U.S. Cl.
CPC .......... *H04L 1/0054* (2013.01); *H04L 1/0631* (2013.01); *H04L 25/067* (2013.01); *H04L 2025/03426* (2013.01)

(58) Field of Classification Search
USPC .................. 375/341, 340, 316, 219, 295
See application file for complete search history.

(56) References Cited

U.S. PATENT DOCUMENTS

| | | |
|---|---|---|
| 2009/0190676 A1 | 7/2009 | Nissani (Nissensohn) |
| 2014/0334561 A1 | 11/2014 | Liang et al. |
| 2017/0077968 A1* | 3/2017 | Hsu ..................... H04B 7/0452 |
| 2017/0163319 A1 | 6/2017 | Chavali et al. |

\* cited by examiner

STOCHASTIC LINEAR DETECTION

CROSS-REFERENCES TO RELATED APPLICATIONS

This application claims the benefit of U.S. Provisional Patent Application No. 62/775,652 entitled "DEVICES, SYSTEMS, AND RELATED METHODS FOR STOCHASTIC LINEAR DETECTORS" and filed on Dec. 5, 2018 for Ahmad RezazadehReyhani et al., which is incorporated herein by reference.

STATEMENT REGARDING FEDERALLY SPONSORED RESEARCH OR DEVELOPMENT

This invention was made with government support under Grant No. 1632569 awarded by the National Science Foundation. The government has certain rights in the invention.

FIELD

This invention relates to signal processing and more particularly relates to multiple-input multiple-output (MIMO) signal detection.

BACKGROUND

In a multiple-input multiple-output (MIMO) system, a transmitter may use multiple transmit antennas to send multiple signals in parallel, and a receiver may use multiple receive antennas to receive multiple signals. Use of a MIMO system rather than a single-input single-output (SISO) system with one transmit antenna and one receive antenna may avoid or mitigate congestion in wireless networks, increase network capacity, or the like. However multiple signals sent in parallel may mix or interfere with each other. For example, a single receive antenna may not receive a signal from a single transmit antenna, but a mix of signals from multiple transmit antennas. Another receive antenna may receive a different mix of signals from the transmit antennas. Additionally, a signal from a transmit antenna may be delayed or attenuated differently, or may include different amounts of noise, when received at different receive antennas.

Multiple signals may also collide, mix, or interfere in other contexts. Inter-symbol interference (ISI), inter-carrier interference (ICI), inter-stream MIMO interference, crosstalk, multi-user interference, or other types of interference may occur in wireless and wired communications, image processing systems, video processing systems, and fiber optic communications, and the like. A variety of MIMO signal detection techniques exist for mitigating or compensating for interference to recover, unmix or estimate the originally transmitted signals. However, MIMO detectors that search for a good estimate of the originally transmitted signals in a large search space of possible transmitted signals may have prohibitively high complexity. On the other hand, lower-complexity MIMO detectors may introduce or propagate errors, or may amplify noise.

SUMMARY

Apparatuses are disclosed for stochastic linear detection. An apparatus, in one embodiment, includes a digital signal processor configured to determine information about a plurality of transmitted signals based on a plurality of received signals. In some embodiments, a digital signal processor includes an initialization module, a sample generation module, and an output module. An initialization module, in one embodiment, is configured to determine an estimator matrix and a noise shaping matrix based on channel state information that relates transmitted signals to received signals. A sample generation module, in one embodiment, is configured to stochastically generate a plurality of signal estimates. In certain embodiments, each signal estimate is a sum of a fixed component and a random component. In some embodiments, the fixed component is based on applying the estimator matrix to a vector of the received signals. In some embodiments, the random component is based on applying the noise shaping matrix to generated noise. An output module, in one embodiment, is configured to send soft information to an error-correcting code (ECC) decoder for decoding bits carried by the transmitted signals. In a further embodiment, the soft information is based on the plurality of signal estimates. In various embodiments, an initialization module, a sample generation module, and an output module may include hardware circuits, programmable hardware circuits and/or executable code. In further embodiments, executable code may be stored on one or more computer readable storage media.

Systems are disclosed for stochastic linear detection. A system, in one embodiment, includes a plurality of receive antennas that receive a set of signals. In a further embodiment, a system includes digital signal processing circuitry that determines information about a plurality of transmitted signals based on the plurality of received signals. In one embodiment, the digital signal processing circuitry determines an estimator matrix and a noise shaping matrix based on channel state information that relates the transmitted signals to the received signals. In one embodiment, the digital signal processing circuitry generates a plurality of signal estimates such that each signal estimate is a sum of a fixed component and a random component. In a further embodiment, the fixed component is based on applying the estimator matrix to a vector of the received signals, and the random component is based on applying the noise shaping matrix to generated noise. In one embodiment, the digital signal processing circuitry sends soft information to an ECC decoder for decoding bits carried by the transmitted signals. In a further embodiment, the soft information is based on the plurality of signal estimates.

Methods are disclosed for stochastic linear detection. A method, in one embodiment, includes determining an estimator matrix and a noise shaping matrix based on channel state information that relates a plurality of transmitted signals to a plurality of received signals. In some embodiments, a method includes stochastically generating a plurality of signal estimates such that each signal estimate is a sum of a fixed component and a random component. In further embodiments, the fixed component is based on applying the estimator matrix to a vector of the received signals, and the random component is based on applying the noise shaping matrix to generated noise. In some embodiments, a method includes sending soft information to an ECC decoder for decoding bits carried by the transmitted signals. In a further embodiment, the soft information is based on the plurality of signal estimates.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
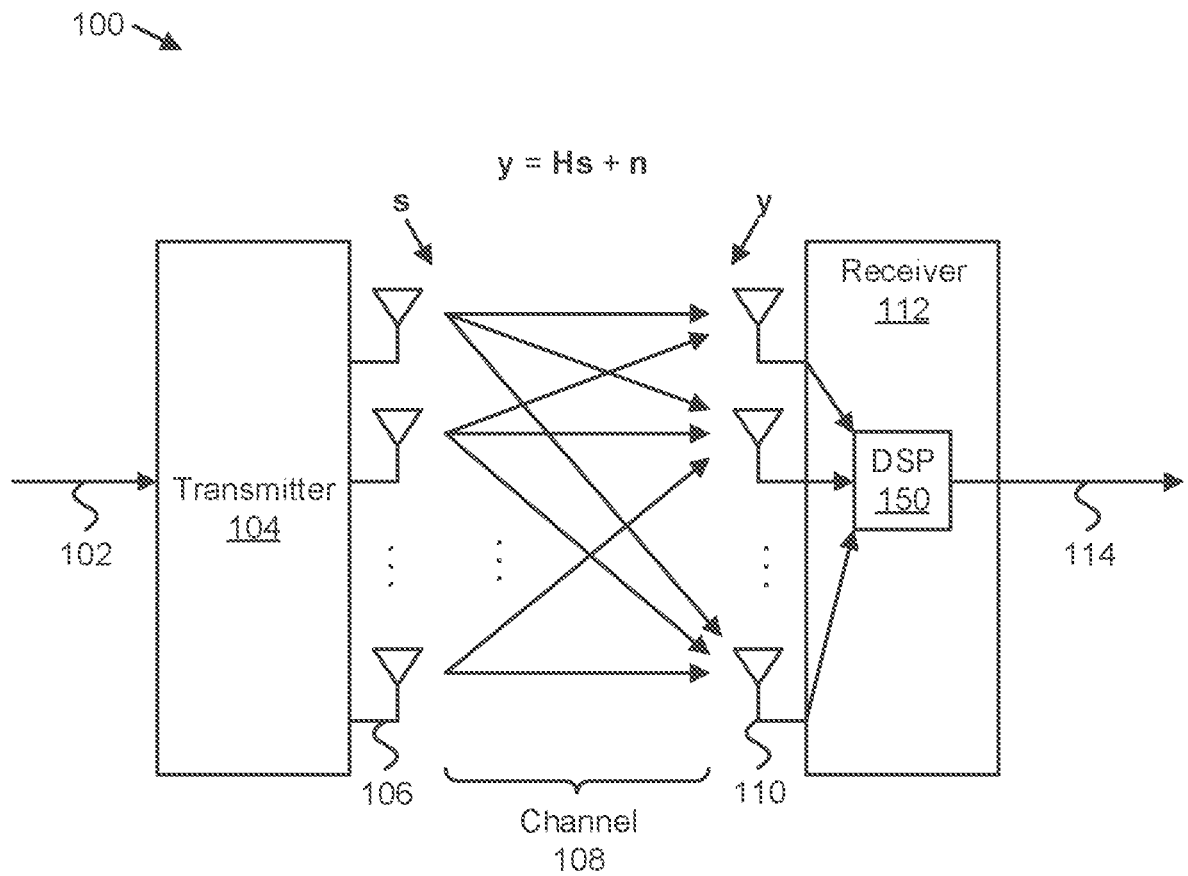
FIG. 1 is a schematic block diagram illustrating one embodiment of a multiple-input multiple-output (MIMO) system.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware circuits or devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C." As used herein, "a member selected from the group consisting of A, B, and C and combinations thereof" includes only A, only B, only C, a combination of A and B, a combination of B and C, a combination of A and C or a combination of A, B and C.

FIG. 1 depicts one embodiment of a multiple-input multiple-output (MIMO) system 100. In the depicted embodiment, the MIMO system 100 includes a transmitter 104 with a plurality of transmit antennas 106, and a receiver 112 with a plurality of receive antennas 110. Data flow in the MIMO system 100 is represented by arrows in FIG. 1. In general, in various embodiments, a transmitter 104 produces a signal or a plurality of transmitted signals, and a receiver 112 receives the signals.

A "signal," in various embodiments, may refer to any time-varying physical property that conveys information, such as a time-varying voltage or current, a modulated electromagnetic wave in the radio spectrum, a modulated electromagnetic wave in the optical spectrum, or the like. Information and signals may be represented using any of a variety of different technologies and techniques. For example, data, instructions, commands, information, signals, bits, symbols, and the like may be represented by voltages, currents, electromagnetic waves, magnetic fields or particles, optical fields or particles, or any combination thereof. Some drawings herein may illustrate signals as a single signal for clarity of presentation and description. However, it will be understood that an illustration or description herein of a signal may represent multiple signals or a bus of signals, of a variety of bit widths. The present disclosure may be implemented on any number of data signals.

In the depicted embodiment, the signals are radio signals produced by the transmitter 104 using the transmit antennas 106, and received by the receiver 112 using receive antennas 110. Transmit antennas 106 may convert electrical current or voltage signals from the transmitter 104 to radio wave signals, and receive antennas 110 may convert received radio wave signals to electrical current or voltage signals processed by the receiver 112.

In another embodiment, however, signals may be signals other than radio signals that are transmitted and received by multiple components other than antennas 106, 110. More generally, a "channel" 108 that conveys the transmitted signals may include any physical transmission medium or set of media. For example, a channel 108 may be a radio-frequency channel for radio signals, or may include one or more metal wires, fiber optic cables, or the like for electrical or optical signals. Although a wireless transmitter 104 and receiver 112 for transmitting radio signals via a radio frequency channel are depicted in FIG. 1, an apparatus, system, or method for stochastic linear detection may be used with a variety of other types of transmitters 104, receivers 112, signals, and channels 108, that transmit and receive signals using antennas 106, 110, or using analogous components for producing and detecting signals other than radio waves.

In the depicted embodiment, the transmitter 104 receives data 102 to be transmitted, and produces a plurality of transmitted signals based on the input data 102. The transmitter 104 may include various components for encoding, transforming, interleaving, and/or modulating the data 102, which are omitted from FIG. 1 for clarity in describing stochastic linear detection. For example, a transmitter 104 may include (or omit) an error-correcting code (ECC) encoder that adds redundant bits to the data 102, an interleaver that changes the order of bits, a mapper that maps bits to amplitudes and/or phases of carrier waves (e.g., by mapping bits to symbols of a quadrature amplitude modulation (QAM) or phase shift keying (PSK) constellation), an orthogonal frequency-division multiplexing (OFDM) modulator that modulates a set of orthogonal sub-carrier frequencies based on the mapped symbols, or the like. Various other or further components for transforming data 102 to signals may be included in or omitted from a transmitter 104.

Conversely, a receiver 112 may include various components for demodulating, de-interleaving, reverse transforming, and/or decoding signals to produce output data 114, which are similarly omitted from FIG. 1 for clarity in describing stochastic linear detection. For example, a receiver 112 may include (or omit) a demodulator, a de-interleaver, an ECC decoder, or the like. Various filters, equalizers, and other or further components for transforming signals to data 114 may be included in or omitted from a receiver 112, but may be omitted from FIG. 1 for clarity.

Components of the MIMO system 100 are designated herein as a transmitter 104 and a receiver 112 for convenience in describing the flow of signals and data. However, in certain embodiment, a MIMO system 100 may include transceivers that are capable of both transmitting and receiving. For example, in MIMO wireless telephony, a phone may function as a transmitter 104 to transmit signals to a cellular base station and as a receiver 112 to receive signals from the base station.

The channel 108 may affect the signals as they are conveyed between the transmitter 104 and the receiver 112. Thus, the plurality of received signals (represented by the vector y) may differ from the plurality of transmitted signals (represented by the vector s). For example, as a signal is transmitted over a channel 108, the signal may be subject to attenuation, delay, noise, and/or interference.

In a single-input, single-output (SISO) system where a transmitter 104 produces one signal (e.g., via one transmit antenna 106) and a receiver 112 receives one signal (e.g., via one receive antenna 110), effects of the channel 108 on the signal may be modeled by the equation y=hs+n. In this equation, y is the received signal and s is the original transmitted signal corresponding to a mapped bit-vector. In certain embodiments, a mapped bit-vector may be a symbol in a QAM constellation, a PSK constellation, or the like. Accordingly, the terms "symbol" and "signal" may be used interchangeably herein with the understanding that physical signals or their mathematical representations correspond to or represent data symbols. The signals y and s in the above equation are frequency-domain representations of the transmitted and received signals, and may be complex-valued functions of frequency so that y(f) for frequency f is a complex number indicating an amplitude and phase for a carrier or sub-carrier wave of frequency f. For example, y and s may be Fourier-transformed versions of time-varying transmitted and received signals.

In the above equation, h is a complex value with amplitude and phase that represent the attenuation and delay of the signal moving from transmitter 104 to receiver 112 through the channel 108, and n is simple additive white Gaussian noise (AWGN) with variance $\sigma_n^2$ per real and imaginary component. Thus, the above equation represents that a received signal is based on a transmitted signal subject to attenuation, delay, and noise.

In a MIMO system 100, the transmitter 104 transmits multiple signals (e.g., via multiple transmit antennas 106), and the receiver 112 receives multiple signals (e.g., via multiple receive antennas 110). In FIG. 1, the connecting arrows between the transmit antennas 106 and the receive antennas 110 represent a multipath signal having complex-valued gain elements representing attenuation and phase delay of signals moving from the transmit antennas 106 to the receive antennas 110. The simple SISO model with one transmit antenna and one receive antenna may be expanded to a MIMO model by constructing vectorized representations of the variables. Thus, a mathematical equation that relates the transmitted signals to the received signals has the following form:

$$y_c = H_c s_c + n_c \qquad (1)$$

In the above equation, $s_c$ is a vector of the transmitted signals (of size $N_t$, where $N_t$ is the number of transmit antennas 106 or other components for transmitting multiple signals), and $y_c$ is a vector of the received signals (of size $N_r$, where $N_r$ is the number of receive antennas 110, or other components for receiving multiple signals, and where $N_r \geq N_t$). Elements of $y_c$ and $s_c$ are complex values in the frequency domain, with amplitude and phase components representing amplitude and phase for frequencies as described above with reference to the SISO equation y=hs+n. The elements of $s_c$ may be complex values from a finite alphabet set (e.g., from a quadrature amplitude modulation (QAM) constellation). Additionally, in some embodiments, various ways of transforming, encoding, or interleaving data may result in the elements of $s_c$ being a set of zero-mean independent complex random variables with variance $\sigma_s^2$ per real and imaginary component.

In Equation 1, $H_c$ is the channel gain matrix (of size $N_r \times N_t$), with complex-valued elements representing the attenuation and delay between each pair of transmit antennas 106 and receive antennas 110 (or other components for transmitting and receiving multiple signals). Lastly, $n_c$ is the channel noise vector (of size $N_r$) representing multivariate additive white Gaussian noise (AWGN), where the elements of $n_c$ are a set of zero-mean independent complex Gaussian random variables with variance $\sigma_n^2$ per real and imaginary component.

In one embodiment of a MIMO system 100, the number of transmit antennas $N_t$ is equal to a number of complex data streams $N_s$, and each data stream may be encoded into one transmitted signal. In another embodiment, the number of transmit antennas $N_t$ may differ from a number of complex data streams $N_s$, and the above equation may be generalized without limitation by making $s_c$ size $N_s$ and H, size $N_r \times N_s$ which includes the combined effects of the $N_r \times N_t$ channel and an $N_t \times N_s$ stream mapping matrix. For simplicity, we will henceforth continue assuming $N_t = N_s$ without loss of generality. Additionally, in certain embodiments, where the number of transmit antennas $N_t$ is equal to a number of receive antennas $N_r$, the unscripted number N may be used where $N = N_t = N_r$.

Elements $h_{ij}$ of the channel matrix 11, in various embodiments, indicate how the $i^{th}$ received signal $y_i$ is affected by the $j^{th}$ transmitted signal $s_j$, after attenuation and delay. For example, a diagonal channel matrix H, would represent that each transmitted signal $s_i$ was received only by a corresponding receive antenna 110 as a received signal $y_i$, meaning that the channel 108 in some way prevented signals from mixing (e.g., if signals were conveyed by separate wires rather than wirelessly). Such a case would be equivalent to multiple non-overlapping SISO signals, and the signals could be processed as in the SISO case, without accounting for mixing of signals or inter-signal interference.

Conversely, in the depicted MIMO system 100 the $i^{th}$ received signal $y_i$ is affected by multiple transmitted signal and the channel matrix $H_c$ has significant non-zero off-diagonal terms. Thus, where the SISO equation y=hs+n represents that a received signal in a SISO system is based on a transmitted signal subject to attenuation, delay, and noise, Equation 1 represents that multiple received signals in a MIMO system 100 are based on the transmitted signals, subject to attenuation, delay, noise, and interference or mixing of the transmitted signals. A MIMO decoder, such as the digital signal processor 150 described below, may receive signals from multiple receive antennas 110, where the received signals are based on transmitted signals from multiple transmit antennas 106, and on channel effects such as attenuation, delay, mixing or interference (indicated by $H_c$) and/or noise (indicated by $n_c$). The MIMO decoder may estimate and/or decode the transmitted signals based on the received signals.

In the previous discussion the system/channel model defined in Equation 1 has been described in a complex-valued form. However, the model thus defined can be in either a complex or real form without loss of generality, therefore an equivalent real version may be defined as follows:

$$H_r = \begin{bmatrix} \Re\{H_c\} & -\Im\{H_c\} \\ \Im\{H_c\} & \Re\{H_c\} \end{bmatrix} \quad (2)$$

$$y_r = \begin{bmatrix} \Re\{y_c\} \\ \Im\{y_c\} \end{bmatrix} \quad (3)$$

$$s_r = \begin{bmatrix} \Re\{s_c\} \\ \Im\{s_c\} \end{bmatrix} \quad (4)$$

$$n_r = \begin{bmatrix} \Re\{n_c\} \\ \Im\{n_c\} \end{bmatrix} \quad (5)$$

$$y_r = H_r s_r + n_r \quad (6)$$

In the above equations, the functions $\Re$ and $\Im$ extract the real and imaginary components, respectively. For simplicity, the real form of the system model y=Hs+n will hereafter be used without the additional subscripted notation. If the complex form is used, operations described below for real-valued vectors and matrices may be replaced by analogous operations for complex-valued vectors and matrices. For example, the operations described below involving the transpose (e.g., $H^T$) of a real-valued matrix or vector may be replaced by analogous operations involving the Hermitian conjugate transpose (e.g., $H^H$) if the complex form is used.

In the depicted embodiment, the receiver 112 includes a digital signal processor (DSP) 150. The term "digital signal processor" as used herein, may refer to circuitry that receives signals (e.g., the signals received and converted to electrical voltages or currents by the receive antennas 110), and processes the signals to produce output data 114. For example, in certain embodiments, the DSP 150 may estimate or decode a plurality of transmitted signals $s_c$ based on a set of received signals $y_c$. In further embodiments, a DSP 150 may perform other or further transformations such as error correction, de-interleaving, or the like, as described above to produce output data 114. In one embodiment, a digital signal processor 150 may be a general-purpose processor that executes code stored on a computer-readable storage medium (e.g., a memory) for processing signals. In another embodiment, a DSP 150 may be a special-purpose processor with an instruction set adapted for signal processing, and may execute code stored on a computer-readable storage medium (e.g., a memory) for processing signals. In further embodiments, a DSP 150 may include one or more hardware circuits or programmable hardware circuits or devices. For example, a DSP 150 may be, or may include, an application-specific integrated circuit, a field programmable gate array, or the like.

An apparatus for stochastic linear detection, in various embodiments, may include a DSP 150. Similarly, a system for stochastic linear detection may include a plurality of receive antennas 110 that receive a set of signals, and may include digital processing circuitry such as a DSP 150. In certain embodiments, a DSP 150 may be configured to perform a method for stochastic linear detection, as disclosed herein.

In the depicted embodiment, the DSP 150 is configured to determine information about a plurality of transmitted signals based on a plurality of received signals. In various embodiments, information about transmitted signals may include one or more estimates of the transmitted signals, one or more estimates of data bits represented or carried by the transmitted signals, likelihood information representing confidence in the estimated data bits, or likelihoods that the estimated data bits are correct, or any other information that may be determined, inferred, or estimated relating to the transmitted signals, based on the received signals. Received signals, in various embodiments, may refer to the signals themselves as received, or to samples of signals (e.g., sampled by a receiver 112), Fourier-transforms of the signals, or the like.

Terms such as "detection," "signal detection," "MIMO detection" and the like are used herein to refer to estimating or otherwise determining information about transmitted signals, based on received signals. A transmitted signal, once detected, estimated, or determined, may be decoded into bits that were encoded into, modulated into, carried by, or represented by the transmitted signal. Accordingly, a DSP 150 used to process received MIMO signals to determine information about transmitted signals may be referred to as a "detector," a "signal detector," a "MIMO detector" or the like. At times, the detector may also be referred to as a "decoder," not to be confused with a decoder for an error-correcting code (ECC), which may be referred to herein as an "ECC decoder." A DSP 150 in an apparatus for stochastic linear detection may also be referred to herein as a "stochastic linear detector.".

In a MIMO system 100, as described above, a detector such as a DSP 150 may determine information about a plurality of transmitted signals based on a plurality of received signals. The term "plurality" is used to refer to a collection of two or more things. For example, because a MIMO system includes multiple inputs and multiple outputs, the plurality of transmitted signals includes at least two transmitted signals, and a plurality of received signals includes at least two received signals. The term "set" may also be used herein to refer to a collection of one or more things. For example, a set of signals is a collection of one or more signals, a set of bits is a collection of one or more bits.

Pluralities, sets, or collections of information or signals may be represented as vectors, matrices, and the like herein for convenience in describing operations of the DSP 150, without regard to how the data, information or signals are stored or processed. For example, a plurality of received signals may be represented or referred to herein as a received signal vector y and a set of transmitted signals may be represented or referred to herein as a transmitted signal vector s, without any implication as to whether elements of either of the signal vectors are stored in contiguous or non-contiguous locations, processed in parallel or in sequence (e.g., using vector processing or scalar processing), or the like. Similarly, a plurality of elements $h_{ij}$ that represent how the $i^{th}$ received signal $y_i$ is affected by the $j^{th}$ transmitted signal $s_j$, after attenuation and delay, may be represented or referred to herein as a channel matrix H, without any implication as to whether the elements of the channel matrix, or of its rows and/or columns, are stored in contiguous or non-contiguous locations, processed in parallel or in sequence (e.g., using vector processing or scalar processing), or the like.

In various embodiments, the DSP 150 may receive or determine channel state information. Channel state information may be any information that relates the transmitted signals to the received signals or describes at least in part how the received signals are related to the transmitted signals. For example, channel state information may include information about properties or conditions of the channel 108, and how the channel affects signals.

In some embodiments, the DSP may receive or determine channel state information based on a training sequence, or known data. For example, when the transmitter 104 sends a data packet, it may include a training sequence or preamble of predetermined signals, and the DSP 150 may determine how factors such as attenuation, delay, noise, and/or interference in the channel 108 affect the received signals, by comparing the received signals to the known or predetermined transmitted signals. Thus, with reference to the channel model y=Hs+n, channel state information may include information about, or estimates of, the channel matrix H, as well as statistical information about the noise vector n, such as a channel noise variance $\sigma_n^2$. The channel matrix H may represent properties of the channel 108 that are at least temporarily consistent, such as attenuation and delay, and the statistical information of the noise vector n may represent inconsistent or randomly-varying noise. The DSP 150 may determine or estimate elements of the channel matrix H, which represent attenuation, delay, and mixing of signals, based on the received training signals. Similarly, although the value of the noise vector n may be different for signals sent at different times in the training sequence (e.g., noise vector n may be a random variable), the DSP 150 may determine information about the noise vector n, such as a variance $\sigma_n^2$, an average energy, or the like.

Thus, in various embodiments, information relating the transmitted signals to the received signals may be, or may include, any form or component of channel state information, such as the channel matrix H, rows, columns, or elements of the channel matrix H, information relating to the channel matrix H such as an average column energy, information about the noise vector n, such as a variance $\sigma_n^2$, average energy, or the like.

In general, in various embodiments, the DSP 150 may detect signals (e.g., determine information about the transmitted signals based on the received signals) by using the channels state information. Given the channel model y=Hs+n, with known information including the received signal vector y and the channel state information (e.g., the channel matrix H and the noise variance $\sigma_n^2$), the unknown information (e.g., the transmitted signal vector s) may be estimated or inferred by the DSP 150. If the noise vector n was fully known or predictable, it would be a simple computation to subtract the known noise vector n from the received signal vector y, then multiply by an inverse of the channel matrix H (or, if H is rectangular, by a left inverse or pseudoinverse) to recover the transmitted signal vector s. In practice, however, two problems arise. First, the noise vector n is a random variable that cannot be subtracted from the received signal vector y, because the exact value of the noise vector n is not known each time the received signal vector y is sampled. Second, the channel matrix H may be ill-conditioned or nearly singular, so that applying or multiplying by an inverse, left inverse, or pseudo-inverse of H tends to amplify noise or errors that could not be subtracted from the received signal vector y.

For example, certain columns of H may be nearly parallel. With regard to columns of H, the channel model y=Hs+n may be represented in vector form as $y=s_0 h_0 + s_1 h_1 +$ $s_2 h_2 + \ldots + s_{2N_t-1} h_{2N_t-1} + n$, where $h_i$ is the $i^{th}$ column of the channel matrix H, indicating how the $i^{th}$ transmitted signal $s_i$ contributes to the total received signal vector y. Some columns $h_i$ and $h_1$ of H may be closer to parallel than to orthogonal, particularly if signals from nearby or otherwise similar transmit antennas 106 are received with similar attenuation and delay by the receive antennas 110. Two nearly-parallel columns of H may indicate that two transmitted signals are transformed by the channel 108 and contribute to the total received signal y in similar ways, and that it may therefore be difficult to separate or distinguish those signals at the receiver 112.

In certain embodiments, the DSP 150 may decode or estimate transmitted signals from the received signals using stochastic linear detection. In general, in various embodiments, linear detection is a general technique useful to estimate or detect transmitted signals (e.g., the transmitted signal vector s) by applying a linear transformation or linear mapping (e.g., represented by a linear estimator matrix W) to the received signals (e.g., the received signal vector y). "Applying" a linear transformation to signals, in various embodiments, may include using a matrix that represents a linear transformation to transform a vector that represents a set or plurality of signals. More generally, "applying" a matrix to a vector may refer to a matrix-vector multiplication, or to any calculation equivalent to or based on a matrix-vector multiplication (e.g., to an equivalent calculation involving elements of a matrix and a vector, regardless of whether those elements are stored in contiguous memory regions, to a calculation involving a subset of rows of a matrix if only a subset of the resulting product vector is to be used, or the like).

In general, the system/channel model $y = Hs + n$ is not a linear transformation of s to produce y. The channel matrix H represents a linear transformation applied to s, but the addition of the noise vector n makes the transformation from s to y non-linear: doubling or halving the energy in the transmitted signals s does not double or halve the energy in the received signals y, because the contribution of the noise vector n to y is not correspondingly doubled or halved. Because the transformation from s to y is non-linear, it may be expected that linear detection, in which a linear transformation is applied to the received signal vector y to generate an estimate $\hat{s}$ of the transmitted signal vector s, results in some amount of error or difference between the (known) estimate $\hat{s}$, and the (unknown) actually transmitted signal vector s.

Thus, in certain embodiments, a DSP 150 using stochastic linear detection may make stochastic or probabilistic modifications to a signal estimate generated by a linear detector or estimator. In effect, adding noise to a signal estimate as a stochastic or probabilistic modification may involve purposefully selecting a "wrong" answer, without knowing whether the adjustment takes the signal estimate closer to or further away from the actual transmitted signal. However, in certain embodiments, adjusting signal estimates with generated noise may result in some subset of the stochastic signal estimates being better estimates than a signal estimate from a deterministic or non-stochastic linear detector. For example, having multiple stochastic signal estimates may be more useful than having a single deterministic signal estimate for producing bit likelihood information for use by an ECC decoder. In certain embodiments, stochastic linear detection may improve the performance of a DSP 150 compared to deterministic linear MIMO detection methods, without the high complexity of optimum or maximum-likelihood detection.

In some embodiments, a DSP 150 using stochastic linear detection may generate a plurality of stochastic signal estimates in a region surrounding the signal estimate from a deterministic linear detector. For example, the stochastic signal estimates may be sampled from a distribution with the deterministic signal estimate as the mean of the distribution. Although the noise vector n is unknown, applying the channel matrix H to the stochastically generated signal estimates s' and comparing the result to the received signal vector y may allow a DSP 150 to evaluate which of the stochastically generated signal estimates s' are likely to be close to the actual transmitted signal vector s, and to determine likelihoods or other information about the bits carried by the transmitted signals, such as log-likelihood ratios for use by an ECC decoder. For example, the DSP may determine an objective function such as the squared distance $\|y - Hs'\|^2$ for each of the stochastically generated signal estimates s', and may base information for ECC decoding on the signal estimates that produce smaller values of the objective function.

In various embodiments, the noise vector n in the system model $y = Hs + n$ may have components that are independent Gaussian random variables, each with zero mean and variance $\sigma_n^2$. However, a multivariate random vector to be added to a signal estimate $\hat{s}$ from a deterministic linear detector, to produce a stochastic signal estimate s' may be shaped such that after pre-multiplication by H it results in a vector with the same statistical characteristics as the noise vector n. Hence, in certain embodiments, a DSP 150 implementing stochastic linear detection may generate signal estimates based on shaped noise. For example, stochastic signal estimates may be generated by sampling random vectors from a multivariate Gaussian distribution with a mean and a covariance matrix, where the mean is based on a signal estimate $\hat{s}$ from a deterministic linear detector or previous estimate and the covariance matrix compensates or partially compensates for the noise-shaping effects of the channel matrix H.

Thus, in one embodiment, a DSP 150 may determine an estimator matrix and a noise shaping matrix based on channel state information. In various embodiments, an estimator matrix may be used to produce a signal estimate as a linear transformation of the received signals, and a noise shaping matrix may be used to shape generated noise, where the shaped noise may be added to the first signal estimate to produce stochastic signal estimates. In a further embodiment, the DSP 150 may stochastically generate signal estimates with a fixed component and a random component, where the fixed component is based on applying the estimator matrix to a vector of the received signals, and the random component is based on applying the noise shaping matrix to the generated noise. In some embodiments, a DSP 150 may use the stochastic signal estimates to produce soft information (e.g., bit likelihood information) about bits carried by the transmitted signals, and may send the soft information to an ECC decoder for decoding the bits.

Various embodiments of stochastic linear detection, or of stochastic linear detectors which may be implemented by a DSP 150 or other digital signal processing circuitry are described in further detail below with reference to FIGS. 2-7. In the following sections, variations of stochastic linear detection are described primarily in the context of a MIMO detector application, though it should be understood that the general technique can be used in many variations with this and other similar signal processing applications.

Additionally, although apparatuses, systems, and methods for stochastic linear detection are disclosed herein with reference to the MIMO system 100 of FIG. 1, the disclosed apparatuses, systems, and methods can be applied to many signal processing systems including single-user MIMO (SU-MIMO), multi-user MIMO (MU-MIMO), multi-user systems and networks, orthogonal frequency-division multiplexing (OFDM), orthogonal frequency-division multiple access (OFDMA), spread-spectrum, code-division multiple access (CDMA), and others where the system includes multiple estimable signals which interfere with each other. Apparatuses, systems, or methods for stochastic linear detection may also be used to solve other problems mathematically analogous to the problem of decoding or estimating transmitted symbols based on received signals and channel information, such as integer least squares problems, and lattice problems, regardless of whether such problems actually involve transmitted and received signals.

Figure 2:
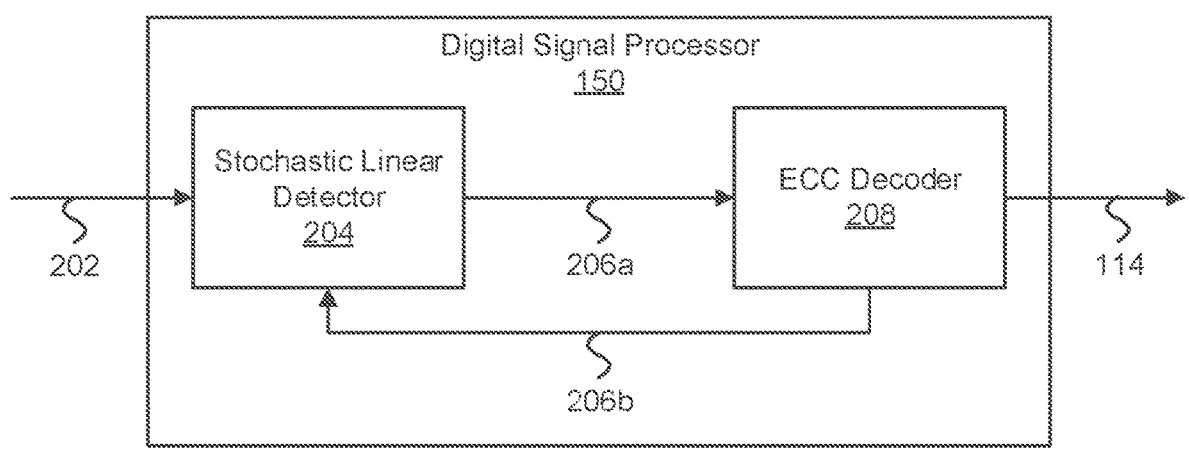
FIG. 2 is a schematic block diagram illustrating one embodiment of a digital signal processor.

FIG. 2 depicts one embodiment of a DSP 150. The DSP 150 may be substantially as described above with reference to FIG. 1, and may be configured to determine information about a plurality of transmitted signals based on a plurality of received signals. In the depicted embodiment, the DSP 140 includes a stochastic linear detector 204, and an error-correcting code (ECC) decoder 208, which are described below.

As described above with reference to FIG. 1, data 102 to be transmitted by a transmitter 104 may be encoded using an error-correcting code that adds redundant bits to the data to compensate for error. The encoded bits (including redundant bits) may be further transformed, interleaved, modulated, and the like to produce the transmitted signals (e.g., transmitted signal vector s). Bits represented by or encoded in the transmitted signal vector s may be referred to herein as the bits carried by the transmitted signal. For example, when an error-correcting code is used, the ECC-encoded bits (including redundant bits) may be the bits carried by the transmitted signal.

The ECC decoder 208, in the depicted embodiment, is configured to decode the (encoded) bits carried by the transmitted signal, based on the error correcting code used to encode the bits, and on information about the bits from the stochastic linear detector 204. Various types of error-correcting codes, and of decoding algorithms that may be used by an ECC decoder 208 exist, many of which are known, and some of which may yet be discovered or invented. Thus, in the depicted embodiment, the ECC decoder 208 produces the output data 114 that the receiver 112 outputs, in the form of ECC-decoded bits, which, if errors were successfully detected and corrected by the ECC decoder 208, should match the data 102 originally provided to the transmitter 104.

In the depicted embodiment, the DSP 150 includes the ECC decoder 208. In another embodiment, the ECC decoder 208 may be external to the DSP 150 and/or the receiver 112, but may similarly communicate with a stochastic linear detector 204 implemented by the DSP 150. For example, in one embodiment, the output data 114 of the receiver may include or be based on signal estimates from the stochastic linear detector 204, and may be provided to an external ECC decoder 208.

The stochastic linear detector 204, in the depicted embodiment, receives the received signals (e.g., received signal vector y) as input data 202, and determines information 206a about the transmitted signals, based on the received signals. In various embodiments, the stochastic linear detector 204 may determine an estimator matrix and a noise shaping matrix based on channel information, stochastically generate signal estimates where each signal estimate is the sum of a fixed component and a random component, and send information to the ECC decoder 208 based on the stochastic signal estimates.

In one embodiment, an ECC decoder 208 may be a hard-decision decoder that receives and decodes estimated bits from a stochastic linear detector 204. In another embodiment, however, an ECC decoder 208 may be a soft-decision decoder that uses soft information about the estimated bits for decoding. Soft information, in various embodiments, may include any information representing confidence in estimated data bits, likelihoods that the estimated data bits are correct. For example, soft information for a bit may indicate the likelihood that a bit is a 1, the likelihood that the bit is a 0, a ratio of the above likelihoods, a log of the likelihood ratio, individual log-likelihoods, or the like.

Thus, in the depicted embodiment, the output data 206a from the stochastic linear detector 204 to the ECC decoder 208 includes soft information. The use of soft information for ECC decoding may significantly improve bit error rates compared to hard-decision decoders, and thus may significantly increase usable ranges for a receiver 112.

Additionally, in the depicted embodiment, the ECC decoder 208 and the stochastic linear detector 204 are connected in a turbo loop configuration, where soft information 206b produced by the ECC decoder 208 is fed back to the stochastic linear detector 204, which may use the soft information 206b to produce new or refined signal estimates, or to otherwise improve the soft information 206a sent to the ECC decoder 208. In some embodiments, many iterations of detecting and decoding may be executed, sending iteratively improved soft information back and forth between the stochastic linear detector 204 and the ECC decoder 208. In another embodiment, a smaller number of detecting and decoding iterations may be performed. Additionally, although FIG. 2 depicts the ECC decoder 208 and the stochastic linear detector 204 are connected in a turbo loop configuration, in another embodiment, soft information feedback 206b from the ECC decoder 208 to the stochastic linear detector 204 so that the output data 114 is produced in a single detection/decoding pass.

A similar turbo loop configuration may be used with MIMO detectors other than a stochastic linear detector 204. Various MIMO systems attempt to mitigate interference such as that caused by inter-symbol interference (ISI), inter-carrier interference (ICI, inter-stream MIMO interference, cross-talk, and multi-user interference, or the like, using techniques such as equalization, maximum likelihood detection, or interference cancellation.

Maximum likelihood detectors, in particular, provide optimum signal detection performance, by searching through the entire space of possible transmitted signal vectors to produce a maximum likelihood signal estimate $s_{ML}$, that minimizes the objective function $\|y-Hs_{ML}\|^2$. The detector may search for all the possible combinations of symbols (equivalently, bits) that may have been transmitted and accordingly infer the likelihood of each bit being 0 or 1. However, the search space for the maximum likelihood signal estimate $s_{ML}$, grows exponentially with the number of bits carried by the transmitted signal vector s, with the result that a maximum likelihood detector has prohibitively high complexity.

For this reason, some detectors other than maximum likelihood detectors provide lower signal detection performance, but with significantly less complexity for implementation. For example, a list sphere detector (LSD) may find a candidate list of likely transmitted bits through a deterministic search that matches the received signals with estimates based on a channel model. The class of list sphere detectors (LSD) is described further in B. M. Hochwald and S. ten Brink, "Achieving near-capacity on a multiple-antenna channel," IEEE Trans. Commun., vol. 51, no. 3, pp. 389-399, March 2003. and Z. Guo, and P. Nilsson, "Algorithm and implementation of the K-best sphere decoding for MIMO detection," IEEE Journal on Selected Areas in Communications, vol. 24, no. 3, pp. 491-503, March 2006.

As another example, detectors may use stochastic search methods based on Markov Chain Monte Carlo (MCMC) algorithm, where a candidate list of the likely transmitted bits is found through a random search through a state-space by examining one bit or one data symbol at a time. MCMC algorithms are described further in B. Farhang-Boroujeny, H. Zhu, and Z. Shi, "Markov chain Monte Carlo algorithms for CDMA and MIMO communication systems," IEEE Trans. Signal. Process., vol. 54, no. 5, pp. 1896-1909, May 2006.

In both cases of LSD and MCMC algorithms for detectors, the candidate lists of likely transmitted bits are used to calculate the log-likelihood ratio (LLR) values of the transmitted bits. These LLR values are then passed as soft information to a forward error correction decoder such as the ECC decoder 208, which may be a turbo decoder, an LDPC decoder, or the like. The ECC decoder 208 can finalize the decisions about the transmitted bits or can generate new soft information that may be passed to the detector (e.g., LSD or MCMC algorithm) for improving the LLR values that will be then sent to the ECC decoder 208 for further processing, in the turbo loop configuration described above.

In some cases, detectors used as practical alternatives to maximum-likelihood detectors may be linear detectors, that generate signal estimates by applying a linear transformation (e.g., represented by a linear estimator matrix W) to the received signals (e.g., the received signal vector y). Some examples of linear detectors include zero-forcing (ZF) detectors, and minimum mean square error (MMSE) detectors. In a ZF detector, the received signal is processed such that the individual bit symbols are separated from each other with no residual interference among them remaining. This type of separation may not always be desirable, as full separation of information symbols is at a cost of some enhancement of the channel noise at the detector output. MMSE detectors provide an alternative method that balances between noise enhancement and residual interference among the symbols.

ZF and MMSE detectors may be simple detectors with low complexity, but this simplicity results in a potentially significant performance loss. An optimum or maximum likelihood detector, on the other hand, removes this performance loss at a cost of much higher complexity.

By contrast, in the depicted embodiment, a stochastic linear detector 204 may stochastically generate multiple signal estimates in a much smaller space than the full search space examined by a maximum likelihood detector. Many useful signal estimates may be in some neighborhood of the ZF and/or MMSE solution. Thus, a stochastic linear detector 204 that generates sufficient signal estimates in the vicinity of the ZF or MMSE solution (or other estimates from other types of deterministic linear detectors) may be able to obtain some useful signal estimates. A detector that generates signal estimates by random sampling in the vicinity of a signal estimate from a linear detector may be referred to as a stochastic linear detector 208, or may be referred to more specifically as a stochastic MMSE detector, a stochastic ZF detector, or the like, determining on the type of linear detection algorithm in use.

Various embodiments of a stochastic linear detector 204 are described below with reference to FIGS. 3-7, including various methods of stochastic sample generation that may lead to good signal detection performance of the stochastic linear detector 204 (as compared to deterministic or non-stochastic linear detectors) with lower complexity than a maximum-likelihood detector. Additionally, various other or further methods of stochastically stochastic signal estimates will be recognized by one of skill in the relevant art, in view of this disclosure.

As background for a description of stochastic linear detection, a general description of linear detection or linear estimation follows. In the equations that follow, the superscript 'T' denotes matrix or vector transpose and E[•] refers to statistical expectation.

Given the received signal vector y, a linear estimate of the transmitted vector s may be obtained as $$\hat{s} = Wy \quad (7)$$
$$= s + v$$

where W is an estimator matrix of size $2N_r \times 2N_r$, (in the real-valued case) and v is an error vector representing the (unknown) difference between the signal estimate $\hat{s}$ and the actually transmitted signal vector s. The error vector v thus represents a combination of residual noise and interference. This treatment ignores any prior information of the transmitted vector s that may be known to the receiver. Consideration of such prior information in the implementation of the detector will be discussed in later parts of this document.

As used herein, the symbol s without further modification is used to represent the unknown, actually transmitted signal vector. With further modification, symbols such as $\hat{s}$, $s_{ZF}$, $s_{MMSE}$, or the like are used to represent estimates of the transmitted signal, where subscripts such as ZF or MMSE indicate that the estimates are produced by the corresponding type of linear detector. With a prime mark, the symbol s' is specifically used to refer to a stochastically generated signal estimate. Additionally, the term "signal estimate" is used to refer to any estimate or candidate for the transmitted signals even if the estimate is deliberately "wrong" due to the addition of stochastically generated noise. Terms such as "estimate of transmitted signals" may also but used, but, given that the received signals are known or sampled by the receiver 112, estimation of the already-known received samples would be redundant, so the term "signal estimate" may be unambiguously used to refer to estimation of the transmitted signals.

Various estimator matrices W may be used to generate a variety of signal estimates $\hat{s}$ based on the received signal vector y. Intuitively, a useful version of an estimator matrix W may be thought of as attempting to solve or "undo" the channel model equation y=Hs+n, so that the signal estimate $\hat{s}$=Wy=WHs+Wn is close to the originally transmitted signal s, meaning that WH would be approximately equal to the identity matrix I, and that Wn would be small or approximately zero. Various ways to determine a linear estimator matrix W may provide different balances between making WH close to the identity matrix (e.g., signal separation) and making Wn close to zero (e.g., avoiding noise enhancement).

Solving Equation 7 for the error vector v=$\hat{s}$−s=Wy−s, and applying the channel model equation y=Hs+n, one will find that $$v = Wn + (WH - I)s. \quad (8)$$

A stochastic linear detector 204 may make stochastic or randomly generated modifications to the signal estimates in attempts to more closely approximate the transmitted signal vector s. Modifications that minimize the error vector v=ŝ−s result in signal estimates closer to s. The transmitted signal vector s may be modeled or interpreted as a multivariate random variable with zero mean and a known covariance matrix. For example, a distribution of samples of s, although deterministically based on input data, may appear to have been sampled from a multivariate probability distribution due to various transformations of the input data prior to transmission. With the transmitted signal vector s interpreted as a random variable, the error vector v=ŝ−s is also a random variable, and minimizing or reducing the error vector v may, in some embodiments, be accomplished by modifying the signal estimates by the addition of randomly generated noise, where the randomly generated noise has statistics (e.g., a mean and/or covariance matrix) similar to or based on the statistics for the error vector v.

Modeling or interpreting n and s as independent random vectors with covariance matrices $C_n = E[nn^T] = \sigma_n^2 I$ and $C_s = E[ss^T] = \sigma_s^2 I$, one may find the covariance matrix of v as $$C_v = \sigma_n^2 W W^T + \sigma_s^2 (WH-I)(WH-I)^T \quad (9)$$

$$= \left( WW^T + \frac{\sigma_s^2}{\sigma_n^2}(WH-I)(WH-I)^T \right)\sigma_n^2.$$

Examples pertaining to the zero-forcing (ZF) and minimum mean-square error (MMSE) forms of linear detectors follow.

In the case of the ZF detector, $$W_{ZF} = (H^T H)^{-1} H^T \quad (10)$$

$$s_{ZF} = (H^T H)^{-1} H^T y = s + v_{ZF} \quad (11)$$

$$v_{ZF} = (H^T H)_{-1} H^T n \quad (12)$$

$$C_v = (H^T H)^{-1} \sigma_n^2. \quad (13)$$

In the case of the MMSE detector, $$W_{MMSE} = \left( H^T H + \left(\frac{\sigma_n^2}{\sigma_s^2}\right) I \right)^{-1} H^T \quad (14)$$

$$s_{MMSE} = \left( H^T H + \left(\frac{\sigma_n^2}{\sigma_s^2}\right) I \right)^{-1} H^T y = s + v_{MMSE} \quad (15)$$

$$v_{MMSE} = \left( H^T H + \left(\frac{\sigma_n^2}{\sigma_s^2}\right) I \right)^{-1} \left( H^T n - \left(\frac{\sigma_n^2}{\sigma_s^2}\right) s \right) \quad (16)$$

$$C_v = \left( H^T H + \left(\frac{\sigma_n^2}{\sigma_s^2}\right) I \right)^{-1} \sigma_n^2. \quad (17)$$

Linear detectors that produce signal estimates, such as a stochastic linear detector 204, may provide soft information 206a to an ECC decoder 208 based on the signal estimates in various ways. Some illustrative examples relative to soft information follow.

In the channel model y=Hs+n, the transmitted signal vector s may be a vector of bit symbols, such as QAM symbols, with each QAM symbol representing a certain number of bits. The coded bits that are carried by the transmitted signal vector s are denoted as $b_k$, for k=0, 1, . . ., which can take the values −1 and +1 to represent binary 0 and 1, respectively. A maximum likelihood detector may generate soft information as log-likelihood ratios (LLR) for the coded bits, based on the available estimate of the channel gain matrix H, the received signal vector y, and the noise variance $\sigma_n^2$. The log-likelihood ratio for $b_k$ is denoted as:

$$\lambda(b_k) = \ln \frac{P(b_k = +1 \mid H, y, \sigma_n^2)}{P(b_k = -1 \mid H, y, \sigma_n^2)} \quad (18)$$

where "ln x" refers the natural logarithm of x. These LLR values are then passed to a channel decoder 208 (e.g., a convolutional, turbo, or LDPC decoder) to extract information bits. The decoder 208 may also generate additional information 206b, known as extrinsic information, that may be fed back to the detector for improving the LLR values and subsequently obtaining more accurate estimates of the transmitted bits. This exchange of information between the detector and the decoder runs in a feedback loop that may be referred to as a turbo loop. Examples of a turbo loop are further disclosed in M. Tuchler "Turbo equalization: principles and new results," IEEE Trans. Commun., vol. 50, no. 5, pp 754-767, May 2002. The concept of a turbo loop in the context of this disclosure will be revisited later in this document.

Various methods exist for determining LLR values for the transmitted bits. Some such methods are disclosed by B. Farhang-Boroujeny et. al., "Markov chain Monte Carlo Algorithms for CDMA and MIMO communication systems," IEEE Trans. on Signal Processing, vol. 54, no. 5, pp. 1896-1909, May 2006, and B. M. Hochwald and S. ten Brink, "Achieving near-capacity on a multiple-antenna channel," IEEE Trans. Commun., vol. 51, no. 3, pp. 389-399, March 2003.

In one embodiment, LLR values may be determined or estimated based on a simplification known as the max-log approximation. Although the max-log approximation is used herein as one example of how a stochastic linear detector 204 may provide LLR values or other soft information to an ECC decoder 208, various other or further ways of calculating or estimating LLR values, such as log-ML (maximum likelihood), log-MAP (maximum a posteriori), or the like, may be used in various other or further embodiments of a stochastic linear detector 204 to generate soft information to send to the ECC decoder 208.

The max-log approximation for Gaussian interference evaluates the LLR of $b_k$ according to $$\lambda(b_k) = \frac{\min\limits_{b_k=-1} \|y - H\hat{s}\|^2 - \min\limits_{b_k=+1} \|y - H\hat{s}\|^2}{2\sigma_n^2} \quad (19)$$

where $\|\bullet\|^2$ denotes the norm-squared of a vector. Also, the two terms in the numerator of the right-hand side of (19) refer to a pair of minimization processes in which $b_k$ is fixed at −1 (equivalent to logic zero) and +1 (equivalent to logic one), respectively, and the rest of the data bits in the signal estimates Ŝ are examined for a plurality of signal estimates. These minimization processes can computationally be very demanding when the transmitted signals carry a large number of bits. For instance, in a 4×4 MIMO system with 64-QAM symbols, ŝ will contain 4×$\log_2 64$=24 bits of data. With one of these bits fixed, examining the remaining bits involves $2^{23}$=8,388,608 potential transmitted sequences to check. This exponential growth of the complexity with the number of bits in ŝ leads to the high complexity described above for the maximum-likelihood decoder. Stochastic linear detectors 204, in various embodiments, may avoid this high complexity.

It may be noted that not all the bit combinations or the possible signal estimates ŝ mentioned above have similar contribution to the LLR values. In fact, only the two signal estimates that minimize $\|y-H\hat{s}\|^2$ for $b_k=-1$ and for $b_k=+1$ contribute to the LLR value in the max-log approximation. For example, if the maximum likelihood signal estimate $s_{ML}$ that minimizes the objective function $\|y-Hs_{ML}\|^2$ is among the signal estimates ŝ generated by a stochastic linear detector 204, then the LLR values generated using the max-log approximation will be approximately correct. In particular, the LLR values will already have attained a stationary sign that is not changed by examining additional signal estimates ŝ. With the sign of the LLR for the $k^{th}$ bit indicating whether the bit is more likely to be a logic zero or a logic one, determining a correct or stationary sign for an LLR value may be a useful feature of the soft information in embodiments of an ECC decoder 208, even if the value of the LLR apart from the sign is a rough approximation.

More generally, using signal estimates that lead to small values for the objective function $\|y-H\hat{s}\|^2$ may lead to useful soft information or approximations of LLR values, in various embodiments leading to good receiver performance. Even if the maximum likelihood (ML) solution $s_{ML}$ is not among the generated signal estimates signal estimates that produce close-to-minimum values of $\|y-H\hat{s}\|^2$ may result in close-to-accurate approximations of LLR values, or at least in LLR approximations with stationary signs that are not changed by examining additional signal estimates ŝ. Thus, the exponential complexity of an ML detector may be avoided by generating and examining signal estimates in a much smaller search space than the entire space of possible transmitted signals, if the search space is selected in ways that produce small values for the objective function $\|y-H\hat{s}\|^2$.

The list sphere decoding and MCMC algorithm that were mentioned earlier are two possible methods for obtaining good signal estimates. Stochastic linear detectors 204, in various embodiments, take a different approach to the deterministic LSD or MCMC algorithms, and stochastically generate signal estimates with random components corresponding to such search space for sample estimates, and thus may avoid the exponential complexity of an ML detector.

Figure 3:
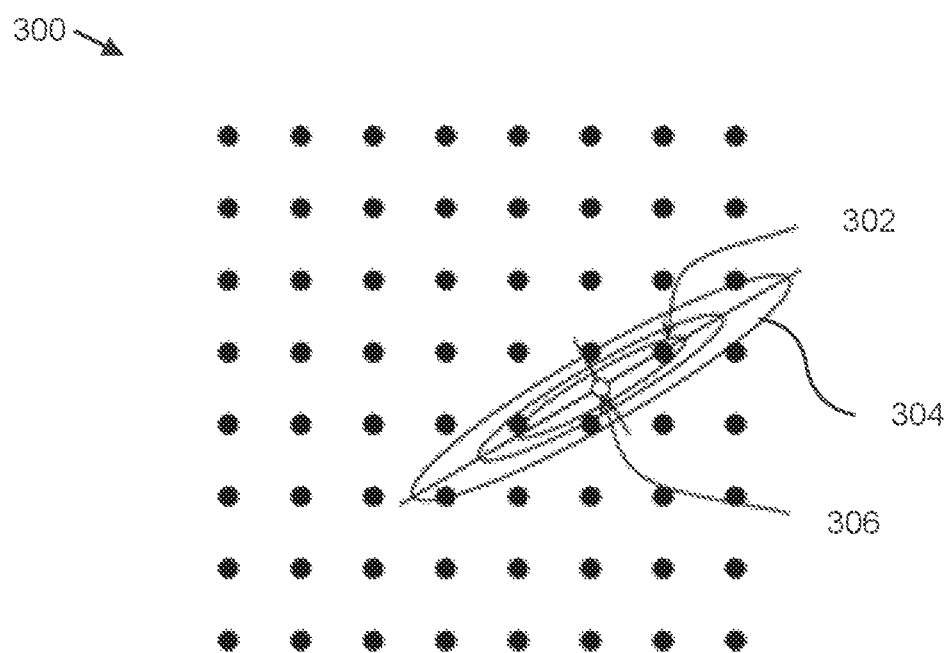
FIG. 3 is a chart illustrating a distribution of signal estimates relative to a set of quadrature amplitude modulation (QAM) lattice points.

FIG. 3 is a chart 300 illustrating a distribution of signal estimates relative to a set of quadrature amplitude modulation (QAM) lattice points. The black dots in the chart 300 represent QAM lattice points, in a 2-dimensional slice through the hyper-dimensional set of QAM lattice points that can be represented by a transmitted signal vector s. One particular black dot 302, indicated by an arrow, represents the actually transmitted signal vector s, or the best estimate of the transmitted signal vector s, which may be a maximum likelihood signal estimate $s_{ML}$. In either case, the transmitted signal vector s and/or the maximum likelihood signal estimate $s_{ML}$ may be unknown due to noise, interference, or the complexity of an ML detector.

A white dot 306 in the chart 300 represents a signal estimate ŝ generated by a linear detector, based on applying an estimator matrix W to the received signal vector y. For example, in various embodiments, the signal estimate ŝ may be the ZF or MMSE signal estimates disclosed above. Other points in the chart 300 (e.g., at other black dots or between the black dots) represent stochastic signal estimates s' at various points within the depicted 2-dimensional slice of the vector space for signal estimates (e.g., at QAM lattice points, or at points other than QAM lattice points). Contours 304 for the objective function $\|y-Hs'\|^2$ are shown, such that stochastic signal estimates s' on the same contour 304 produce the same value for the objective function $\|y-Hs'\|^2$. Signal estimates s' that lead to small values of the objective function $\|y-Hs'\|^2$ are likely to be within the depicted contours. For example, the dot 302 indicating the maximum likelihood signal estimate $s_{ML}$ is within the contours 304. As described above, such signal estimates may be used by a stochastic linear detector 204 to produce useful or stationary-sign approximations of LLR values, to send as soft information 206a to an ECC decoder 208. Thus, the shape of the contours 304 suggests the shape of a probability distribution that a stochastic linear detector 204 may use for stochastically generating signal estimates s'.

However, as indicated above, the chart 300 represents a two-dimensional slice or subspace of the space of possible signal estimates. In the full hyper-dimensional space of possible signal estimates, the shape of a probability distribution may be indicated by statistics such as a covariance matrix for a multivariate probability distribution.

In some embodiments, a stochastic linear detector 204 may generate a stochastic signal estimate s' by initially generating a linear signal estimate ŝ=Wy, (e.g., using ZF or MMSE linear estimator matrices as described above) and then adding a random variable v' representing shaped noise. In some embodiments, a stochastic linear detector 204 may produce stochastic signal estimates (also referred to as samples) s'=ŝ+v' where v' is a random vector. In further embodiments, the added random vector v' may be sampled from a probability distribution designed such that at least some subset of the generated samples s' after hard decision (e.g., quantization to a QAM lattice point) are in the neighborhood of the ML solution 302. The metric for the neighborhood, here, may be measured by the squared distance $\|y-Hs'\|^2$. This stochastic sampling process can thus be thought of as sampling using a shaped random noise sequence around a center provided by a linear estimator as in $$s'=\hat{s}+v'=Wy+Dn' \qquad (20)$$

where W is an estimator matrix based on channel state information, n' is a random vector representing generated noise (e.g., sampled or generated from a multivariate normal distribution with independent components, zero mean, and unit variance), and where D is a noise shaping matrix. Thus, a stochastic linear detector 204 can solve for a single sampling center (e.g., sampling estimate ŝ) and may generate multiple shaped noise samples v'=Dn' to be used in generating the stochastic signal estimates s'.

In one embodiment, the same matrix W may be used by a stochastic linear detector 204 as the estimator matrix and the noise shaping matrix (e.g., W=D). In another embodiment, the noise shaping matrix D is not equal to the estimator matrix W. Various embodiments of a noise shaping matrix D are described below.

In one embodiment, the stochastic linear detector 204 may use the zero-forcing (ZF) linear detector $W_{ZF}=(H^TH)^{-1}H^T$ for both the estimator matrix W and the noise shaping matrix D. First, a linear estimate to be used as the sampling center is produced according to $$\hat{s}=s_{ZF}=(H^TH)^{-1}H^Ty. \qquad (21)$$

Next, let $s_{ML}$ denote the desirable ML solution. If we have a random vector v' that leads to a stochastic signal $s'=s_{mL}$, then we obtain the minimum of the objective function $\|y-Hs'\|^2$. Thus, a random vector v' to be added to the fixed signal estimate ŝ to generate stochastic signal estimates s' in the vicinity of the ML solution may be $v'=v_{ZF}=s'-s_{ZF}$ and we may find that $$\begin{aligned}\|y - Hs'\|^2 &= \|y - H(s_{ZF} + v')\|^2 \\ &= \|y - H((H^TH)^{-1}H^Ty + v')\|^2 \\ &= \|Hv'\|^2 \\ &= v'^T H^T H v'.\end{aligned} \quad (22)$$

Making use of this observation, in some embodiments, a stochastic linear detector 204 may obtain random samples of v' that lead to small values for the quadratic form $v'^T H^T H v'$, by generating samples of $v_{ZF}$. Recalling that $v_{ZF}=(H^TH)^{-1}H^Tn$ (as in Equation 12), a stochastic linear detector 204 generates a sample of $v_{ZF}$ as follows. The random vector n' with independent Gaussian elements of variance $\sigma_n^2$ is generated and the result is multiplied by the noise shaping matrix $D=W_{ZF}=(H^TH)^{-1}H^T$.

The covariance matrix of $v_{ZF}$ may be obtained as $$E[v_{ZF}v_{ZF}^T]=(H^TH)^{-1}H^TE[nn^T]H(H^TH)^{-1}=\sigma_n^2 (H^TH)^{-1}. \quad (23)$$

In a more general case using an estimator matrix W, not necessarily the ZF estimate, the stochastic linear detector 204 may use linear estimator W to produce a signal estimate ŝ'=Wy to be used as a sampling center for generating stochastic signal estimates s'=ŝ+v'=Wy+v'. In this case, the objective function $\|y-Hs'\|^2$ has the following form:

$$\begin{aligned}\|y - Hs'\|^2 &= \|y - H(\hat{s} + v')\|^2 \\ &= \|y - H(Wy + v')\|^2 \\ &= \|a - Hv'\|^2\end{aligned} \quad (24)$$

where a=(I−HW)y. When H, y, and W are known, the vector a is a constant. Here, the random choices of v' that lead to a set of stochastic signal estimates s' at the vicinity of $s_{mL}$ are those that belong to a distribution that covers the points that result in small values for $\|a-Hv'\|^2$. This problem can be converted to a similar form as (22) by factoring H within the norm. This leads to $$\|y-Hs'\|^2=(v'-a')^TH^TH(v'-a') \quad (25)$$

where $a'=H^\dagger a$ and $H^\dagger=(H^TH)^{-1}H^T$ is the Moore-Penrose pseudoinverse of H. Thus, a stochastic linear detector 204 may generate samples of v' a' (instead of v') that result in small values for the right-hand side of (25). The stochastic linear detector 204 may add the bias of a' back into the generated samples to obtain samples of v', and may then add the samples of v' may be added to Ŝ'=Wy to get the stochastic signal estimates s' that will be used in the max-log approximation (Equation 19) for calculating the LLR values $\lambda(b_k)$ for the coded bits $b_k$ carried by the transmitted signal vector s.

Thus, the search method for a stochastic linear detector 204 using a generalized estimator matrix W may be similar to the method described above used for the zero forcing estimator $W_{ZF}$: A random vector n' with independent Gaussian elements of variance $\sigma_n^2$ is generated and the result is multiplied by a noise shaping matrix (e.g. D=W) to produce samples of v'−a'.

Figure 4:
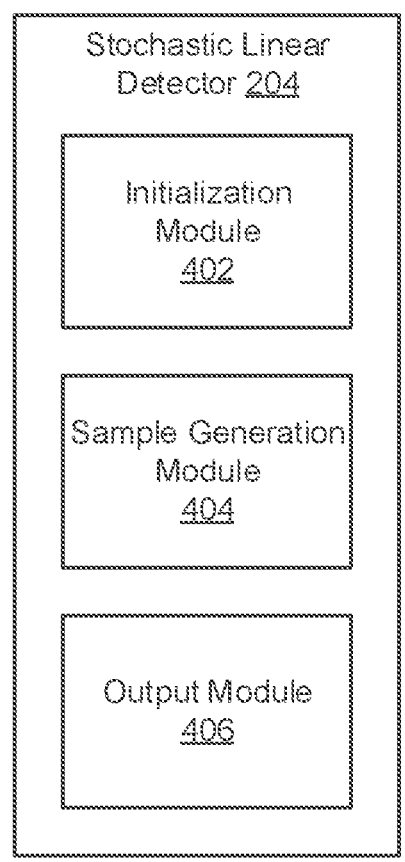
FIG. 4 is a schematic block diagram illustrating one embodiment of a stochastic linear detector.

FIG. 4 depicts one embodiment of a stochastic linear detector 204. In various embodiments, the stochastic linear detector 204 may be substantially as described above with reference to FIGS. 1-3. In the depicted embodiment, the stochastic linear detector 204 includes an initialization module 402, a sample generation module 404, and an output module 406, which are described below.

The initialization module 402, in various embodiments, is configured to determine an estimator matrix W and a noise shaping matrix D based on channel state information. As described above, channel state information may be any information that relates the transmitted signals to the received signals such as the channel matrix H, a channel noise variance $\sigma_n^2$, or the like.

In one embodiment, the initialization module 402 may determine an estimator matrix W by selecting a particular type of linear detector algorithm such as a ZF or MMSE algorithm, or the like, and calculating the estimator matrix W corresponding to that linear detector algorithm. Various linear algorithms and corresponding estimator matrices W, whether known or yet to be discovered, may be used by an initialization module to determine an estimator matrix based on channel information In some embodiments, the initialization module 402 may determine a noise shaping matrix D by selecting the estimator matrix W as the noise shaping matrix D. Thus, in some embodiments, the noise shaping matrix D is equal to the estimator matrix W. In another embodiments, the noise shaping matrix D is not equal to the estimator matrix W, and the initialization module 402 may determine a noise shaping matrix D may determine the noise shaping matrix D. For example, for a stochastic linear decoder 204 to produce random vectors v' with a distribution similar to the distribution of error vectors v, an initialization module 402 may solve the equation $DD^T=C_v$, where $C_v$ is the covariance matrix for error vectors v. Options the initialization module 402 may use to solve $DD^T=C_v$ for the noise shaping matrix D include Cholesky factorization, spectral decomposition, and the like. A noise shaping matrix D generated with the property that $DD^T=C_v$ may be applied to a random vector n' generated with independent components, zero mean, and unit variance to produce a random vector v'=Dn' with the same covariance as the error vector v. Various other or further ways for an initialization module 402 to determine an estimator matrix W and a noise shaping matrix D are described in further detail below.

The sample generation module 404, in one embodiment, is configured to stochastically generate a plurality of signal estimates s'. In various embodiments, a stochastically generated signal estimate s' may be a sum of a fixed component and a random component. For example, in one embodiment, the signal estimate s' may be s'=ŝ+v'=Wy+Dn', where ŝ=Wy is the fixed component, and where v'=Dn' is the random component.

In some embodiments, the fixed component of a signal estimate s' may be based on applying the estimator matrix W determined by the initialization module 402 to a vector y of the received signals, and the random component of a signal estimate s' may be based on applying the noise shaping matrix D determined by the initialization module 402 to generated noise. In various embodiments, a signal estimate may be a sum of two component vectors where one component vector referred to as the "random component" depends on noise generated for that signal estimate, and where the other component vector referred to as the "fixed component" is independent of the noise generated for that signal estimate. The term "component" is used to refer to the two vectors that sum to the signal estimate s', and is not used to imply that the two components are (or are not) orthogonal, or that they are elements or basis vectors for the signal estimate. Additionally, a signal estimate may be a sum of a fixed and a random component, without the fixed and random components having been directly added to produce the signal estimate. For example, a randomly generated vector may be added to a deterministically generated vector, and the sum may be scaled by matrix or scalar multiplication to produce a result that is decomposable as the sum of a fixed component and a random component, without either the fixed component and a random component having been directly calculated.

Additionally, the term "fixed component" is used in contrast to the "random component" that depends on generated noise for a signal estimate s', and is not used to imply that the same component is constant across all of the stochastically generated signal estimates s'. In some embodiments, different signal estimates s' may have the same fixed component, or may have different fixed components. Furthermore, in some embodiments, a "fixed component" independent of generated noise for one signal estimate may or may not be fully deterministic. For example, a fully deterministic fixed component may be $\hat{s}=Wy$, as described above. However, in some embodiments, a fixed component for one stochastically generated signal estimate s' may depend on one or more previous stochastically generated signal estimates s'. For example, a fixed component for one or more subsequent signal estimates may be shifted to a previous signal estimate s' for which the objective function $\|y-Hs'\|^2$ is smaller than for other signal estimates s'.

In one embodiment, the fixed component of a signal estimate s' may be based on applying the estimator matrix W determined by the initialization module 402 to the received signal vector y. In further embodiments, a fixed component "based on" applying the estimator matrix W to the received signal vector y may either equal the product Wy, or may equal that product after some further transformation. For example, the product Wy may be quantized to a valid QAM lattice point, or the fixed component may be shifted to a previous signal estimate s' with a fixed component of Wy, and the resulting fixed component may still be said to be "based on" applying the estimator matrix W to the received signal vector y.

In some embodiments the random component of a signal estimate s' may be based on applying the noise shaping matrix D determined by the initialization module 402 to generated noise. For example, the sample generation module 404 may generate a random component of a signal estimate s' by generating noise, or by receiving generated noise from a random noise generator. The generated noise may be a sample of random noise, pseudorandom noise, or the like, sampled according to one of various methods, known or yet to be discovered, for random or pseudorandom noise generation. The sample generation module 404 may generate a noise vector with a per-element variance based on the channel noise variance $\sigma_n^2$, or may scale unit-variance noise based on the noise variance $\sigma_n^2$, and may then shape the noise using the noise shaping matrix D. In some embodiments scaling by a noise variance may be done as a separate step from shaping the noise using the noise shaping matrix D. In other embodiments, the noise shaping matrix D may incorporate the effect of scaling by a noise variance, and may be applied to unit-variance generated noise.

Additionally, a random component of a signal estimate s' may be referred to as "based on" applying the noise shaping matrix D to generated noise n' if the random component either equals the result of applying the noise shaping matrix D to generated noise, or if the random component equals that result after some further transformation. For example, the product Dn' may be quantized, scaled up to provide a greater diversity of signal estimates s', or the like, and the resulting random component may still be said to be "based on" applying the noise shaping matrix D to generated noise n'.

In some embodiments the plurality of signal estimates s' stochastically generated by the sample generation module 404 may be a predetermined number of signal estimates s', which may be based on experimentation with exemplary data. In another embodiment, the sample generation module 404 may dynamically determine how many signal estimates s' to produce. For example, the sample generation module 404 may define or reference a threshold for LLR output quality, and may iteratively generate signal estimates s' until the LLR output from the output module 406 satisfies a quality threshold. One such threshold may be if the sign of the LLR output is stationary for a certain or predetermined number of iterations, where each iteration includes generating an additional sample estimate s' and updating the soft information output from the output module 406 based on the new sample estimate s'.

The output module 406, in the depicted embodiment, is configured to send soft information to an ECC decoder 208 for ECC decoding of the bits carried by the transmitted signals. The output module 406 may determine the soft information as LLR values, LLR approximates, or other bit likelihood information, where the soft information is based on the plurality of signal estimates generated by the sample generation module 404. For example, in one embodiment, the output module 406 may determine the soft information by applying the max-log approximation described above to the signal estimates, or by applying another LLR calculation or estimation algorithm such as log-ML, log-MAP, or the like. The output module 406 may send the soft information thus determined to an ECC decoder 208 by storing the soft information in shared memory, sending the soft information over a bus, or the like.

In one embodiment, the sample generation module 404 is configured to stochastically generate a signal estimate s' by determining a fixed component for the signal estimate, generating noise n' based on a Gaussian probability distribution, applying the noise shaping matrix D to the generated noise to determine the random component, and adding the random component to the fixed component. For example, in one embodiment, the signal estimate s' may be given by $s'=\hat{s}+v'=Wy+Dn'$. The sample generation module 404 may generate the fixed component $\hat{s}=Wy$, generate the noise vector n' by sampling from a Gaussian probability distribution, apply the noise shaping matrix D to the noise vector n' to determine the random component $v'=Dn'$, and may add the random component to the fixed component to produce the signal estimate s'.

In another embodiment, the noise shaping matrix D is equal to the estimator matrix W, and the sample generation module 404 is configured to stochastically generate a signal estimate s' by generating the noise based on a Gaussian probability distribution, adding the noise to the vector y of received signals, and applying the noise shaping matrix to the sum of the noise and the vector of received signals. For example, where W=D, and the signal estimate s' may be given by $s'=Wy+Dn'=W(y+n')$. Thus, the sample generation module 404 may generate the noise vector n' by sampling from a Gaussian probability distribution, add the generated noise vector n' to the received signal vector y, and apply the noise shaping matrix W to the resulting sum to produce the signal estimate s'.

In one embodiment, a stochastic linear detector 204 may use the ZF estimator signified by the gain matrix $W_{ZF}$ presented in Eq. 10. Here, considering Eq. 12, each sample of the vector $v_{ZF}$ may be generated by the sample generation module 404 by first generating a random vector n' of size $2N_r \times 1$ with independent Gaussian elements and variance $\sigma_n^2$ (e.g., as a sample of the noise vector n) and then pre-multiplying the result by the matrix $W_{ZF}=(H^TH)^{-1}H^T$. A number of such random vectors $v'=W_{ZF}n'$ (e.g., samples of the vector $v_{ZF}$) may be generated and added (possibly, after using a scaling factor K) to $s_{ZF}$ and the results quantized to valid symbols to obtain a set of samples of s'. produced by the sample generation module 404. These may be used by the output module 406 to obtain soft information such as estimates of the LLR values $\lambda(b_k)$ for bits $b_k$ carried by the transmitted signal vector s.

The scaling factor K that is mentioned above, and elsewhere herein, is to control the span of the domain over which the samples of the random vector v' are taken. A larger K expands this domain for taking a wider diversity and a larger number of samples of s. In some embodiments, a larger number of samples will likely lead to improved signal detection performance, but at a higher complexity cost.

In another embodiment, a stochastic linear detector 204 may use the MMSE detector signified by the gain matrix $W_{MMSE}$ presented in Eq. 14. Here, considering the covariance matrix $C_v$ presented in Eq. 17, to generate samples of the vector $v_{MMSE}$, a sample generation module 404 may proceed as follows. First, the sample generation module 404 may find a matrix D that satisfies the identity $DD^T=(H^TH+(\sigma_n^2/\sigma_s^2)I)^{-1}$. Then, each sample of the vector $v_{MMSE}$ may be produced by first generating a random vector of size $2N_r \times 1$ with independent Gaussian elements and variance $\sigma_n^2$ and then pre-multiplying the result by the matrix D. A number of such random vectors (samples of the vector $v_{MMSE}$) may be generated and added (possibly, after adding a scaling factor K) to $\hat{s}_{MMSE}$ and the results quantized to valid symbols to obtain a set of samples of s'. These may be used by the output module 406 to obtain soft information such as estimates of the LLR values $\lambda(b_k)$ for bits $b_k$ carried by the transmitted signal vector s.

Figure 5:
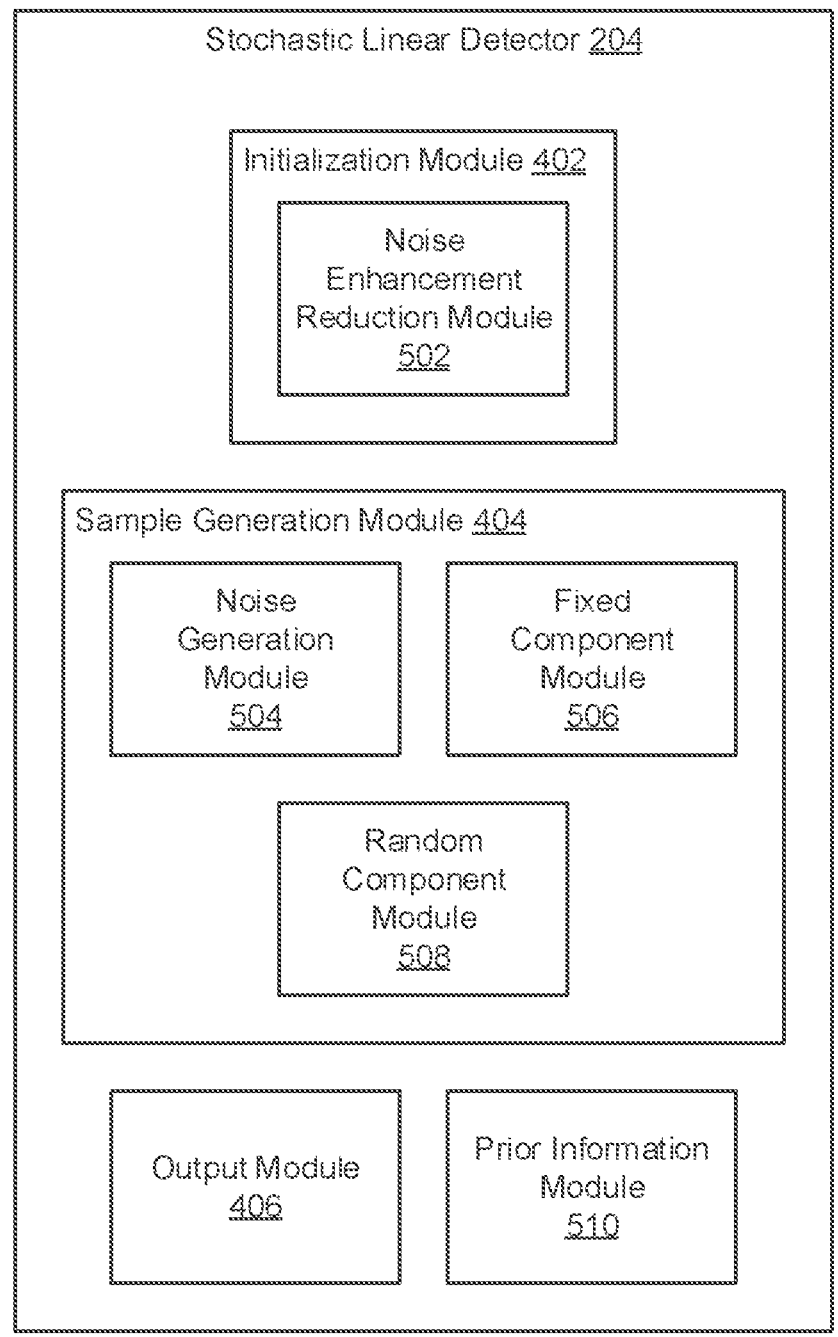
FIG. 5 is a schematic block diagram illustrating another embodiment of a stochastic linear detector.

FIG. 5 depicts another embodiment of a stochastic linear detector. In various embodiments, the stochastic linear detector 204 may be substantially as described above with reference to FIGS. 1-4, including an initialization module 402, a sample generation module 404, and an output module 406 as described above. In the depicted embodiment, the initialization module 402 includes a noise enhancement reduction module 502. In the depicted embodiment, the sample generation module 404 includes a noise generation module 504, a fixed component module 506, and a random component module 508. In the depicted embodiment, the stochastic linear detector 204 includes a prior information module 510.

The prior information module 510, in various embodiments, may obtain or generate prior information about the transmitted signal vector s. Prior information may include statistics for the transmitted signal vector s, such as a mean or covariance matrix. In some embodiments, prior information may include soft information such as LLR values for bits carried by the transmitted signal vector s. For example, in a turbo loop configuration, the prior information module 510 may receive soft information generated or updated by the ECC decoder 208. In some embodiments, the initialization module 402 may use the prior information obtained or generated by the prior information module 510 to determine the estimator matrix W and/or the noise shaping matrix D. For example, wherein the estimator matrix W and/or the noise shaping matrix D may be based on soft information from the ECC decoder 208, received by the prior information module 510. Soft information may be used to change the sampling center or fixed component of a sample estimate, or to change the shape of a sampling region (e.g., to change a covariance matrix produced by shaping noise using the shaping matrix D). In certain embodiments, the output module 406 may use prior information obtained or generated by the prior information module 510 to determine, refine, or update soft information it sends to the ECC decoder 208. Various uses of prior information are described in further detail below.

In the description of an MMSE based stochastic linear detector 204, it was assumed that $v_{MMSE}$ is a zero-mean Gaussian vector. In particular, we ignored the fact that according to Eq. (16) the vector $$v_{MMSE} = \left(H^TH + \left(\frac{\sigma_n^2}{\sigma_s^2}\right)I\right)^{-1}\left(H^Tn - \left(\frac{\sigma_n^2}{\sigma_s^2}\right)s\right)$$

is a linear combination of the channel noise vector n and the transmit signal vector s, and, in practice, some a priori information about s may be available. When such a priori information of s is available, a stochastic linear detector 204 may take the following approach to obtain a more effective set of samples of s.

Any a priori information about s may be used to calculate the mean of s, denoted by $\bar{s}$, and its covariance matrix $C_s = E[(s-\bar{s})(s-\bar{s})^T]$. With this information and assuming that the random vectors s and n are uncorrelated, one will find that the vector $v_{MMSE}$ may be treated as a random vector with the mean of $-(H^TH(\sigma_n^2/\sigma_s^2)I)^{-1}(\sigma_n^2/\sigma_s^2)\bar{s}$ and a respective covariance matrix $$C'_v = \left(H^TH + \left(\frac{\sigma_n^2}{\sigma_s^2}\right)I\right)^{-1} H^TC_nH\left(H^TH + \left(\frac{\sigma_n^2}{\sigma_s^2}\right)I\right)^{-1} + \left(H^TH + \left(\frac{\sigma_n^2}{\sigma_s^2}\right)I\right)^{-1}\left(\frac{\sigma_n^2}{\sigma_s^2}\right)^2 C_s\left(H^TH + \left(\frac{\sigma_n^2}{\sigma_s^2}\right)I\right)^{-1},$$

where $C_n = \sigma_n^2 I$ and $C_s$, as mentioned above, is calculated based on the available a priori information of the random vector s. We may also note that in most of the practical systems, due to bit interleaving after channel decoding, the element of the transmit vector s are assumed to be a set of independent random variables. In that case, the covariance matrix $C_s$ is diagonal, but in presence of some a priori information, its diagonal elements may be non-identical.

With the above information, to generate samples of the vector $v_{MMSE}$, one may proceed as follows. First, find a matrix D' that satisfies the identity $D'D'^T=C'_v$. Then, each sample of the vector $v_{MMSE}$ may be produced by first generating a random vector of size $2N_r \times 1$ with independent Gaussian elements with variance unity, pre-multiplying the result by the matrix KD', where K is a scaling factor, and then adding the mean value $-(H^TH+(\sigma_n^2/\sigma_s^2)I)^{-1}(\sigma_n^2/\sigma_s^2)\bar{s}$ to the result. A number of such random vectors (samples of the vector $v_{MMSE}$) are generated and added to $\hat{s}_{MMSE}$ and the results are quantized to obtain a set of samples of s. These samples may be used in Eq. (19) to obtain estimates of the LLR values $\lambda(b_k)$ for all coded bits $b_k$ carried by the transmit vector s.

To avoid the additional computations needed to compute the factorization D', one may choose to use $C'_\nu H^T$ as a substitute to D'. By avoiding the factorization, one may end up with a reduced cost implementation.

Another way to consider the use of prior information in the stochastic linear detector is as follows. When a priori information about the transmitted bits $b_k$ is available, e.g., from the channel decoder, an improved version of the linear detector that was previously presented in Eq. (7) may be used. One such detector may be expressed as $$\hat{s} = W(y - H\bar{s}) + \bar{s} \quad (26)$$
$$= s + v.$$

Here, $\bar{s}$ is the mean or expected value of s that is calculated based on the available a priori information of s. Also, considering Eqs. (6) and (26), one will find that $$v = Wn + (WH - I)(s - \bar{s}). \quad (27)$$

Moreover, recalling that n and s may be independent random vectors with covariance matrices $C_n = E[nn^T] = \sigma_n^2 I$ and $C_s = E[(s-\bar{s})(s-\bar{s})^T]$, one may find the covariance matrix of v as $$C_v = (WW^T)\sigma_n^2 + (WH-I)C_s(WH-I)^T. \quad (28)$$

Also, as mentioned above, one may note that in most of the practical systems, due to bit interleaving after channel decoding, the element of the transmit vector s are a set of independent random variables. In that case the covariance matrix $C_s$ is diagonal, but, in presence of some a priori information, its diagonal elements may be different.

As in the case of detector (7), one may also suggest the ZF and MMSE detector for the modified detector (26). Here, in the case of ZF detector, $$W_{ZF} = (H^T H)^{-1} H^T \quad (29)$$

$$s_{ZF} = (H^T H)^{-1} H^T (y - H\bar{s}) + \bar{s} = s + v_{ZF} \quad (30)$$

$$v_{ZF} = (H^T H)^{-1} H^T n \quad (31)$$

$$C_v = (H^T H)^{-1} \sigma_n^2. \quad (32)$$

These equations are similar to those in (10) to (13). The primary difference is that Eq. (30) is a rearrangement of Eq. (11). However, when it comes to the MMSE detector, the relevant equations differ significantly. Here, $W_{MMSE}$ is used to obtain an estimate of s which has a known covariance matrix $C_s = E[(s-\bar{s})(s-\bar{s})^T]$. The conventional MMSE detector that lead to Eqs. (14) to (17) ignored this information and estimated the vector s assuming that s had zero mean and covariance matrix $C_s = \sigma_s^2 I$. Taking this new information of the vector s into account, the following set of modified equations are obtained for the MMSE detector, $$W_{MMSE} = (H^T H + \sigma_n^2 C_s^{-1})^{-1} H^T \quad (33)$$

$$s_{MMSE} = (H^T H + \sigma_n^2 C_s^{-1})^{-1} H^T (y - H\bar{s}) + \bar{s} = s + v_{MMSE} \quad (34)$$

$$v_{MMSE} = (H^T H + \sigma_n^2 C_s^{-1})^{-1} (H^T n - \sigma_n^2 C_s^{-1}(s - \bar{s})) \quad (35)$$

$$C_v = (H^T H + \sigma_n^2 C_s^{-1})^{-1} \sigma_n^2. \quad (36)$$

Here, taking the same approach as to what was discussed for the MMSE based stochastic linear detector to generate samples of $v_{MMSE}$ one may proceed as follows. First, find a matrix D that satisfies the identity $DD^T = (H^T H + \sigma_n^2 C_s^{-1})^{-1}$. Then, each sample of the vector $v_{MMSE}$ may be produced by first generating a random vector of size $2N_t \times 1$ with independent Gaussian elements and variance $\sigma_n^2$ and then premultiplying the result by the matrix D. A number of such random vectors (samples of the vector $v_{MMSE}$) may be generated and added (possibly, after using a scaling factor K) to $s_{MMSE}$ and the results quantized to valid symbols to obtain a set of samples of s'. These samples may be used in Eq. (19) to obtain estimates of the LLR values $\lambda(b_k)$ for all coded bits $b_k$ carried by the transmit vector s.

In further embodiments, the output module 406 may include prior information in calculating the output soft information to output to an ECC decoder 208. One such modification is described in B. M. Hochwald and S. ten Brink, "Achieving near-capacity on a multiple-antenna channel," IEEE Trans. Commun., vol. 51, no. 3, pp. 389-399, March 2003. Instead of the max-log LLR approximation defined by Eq. (19), LLR L.) output may be calculated as follows:

$$\lambda(b_k) = \frac{\min_{b_k=-1}\{\|y - H\hat{s}\|^2 - b^{\setminus k} \cdot \lambda^{a,\setminus k}\} - \min_{b_k=+1}\{\|y - H\hat{s}\|^2 - b^{\setminus k} \cdot \lambda^{a,\setminus k}\}}{2\sigma_n^2} \quad (37)$$

where b is the vector of transmitted bits carried by the transmit symbol vector $\hat{s}$, $\lambda^a$ is the vector of the corresponding a priori bits (in the form of LLR values), "•" denotes the dot product of the two vectors, and "\k" specifies that the $k^{th}$ element is excluded from the respective vector.

In some embodiments, this use of a priori information in the output LLR calculation is used with a turbo equalization system with multiple loop iterations. An optimization of this may be to reuse a list of samples of s' in each detector iteration, updating the LLR values with the new prior information from the previous iteration of the FEC decoder. This may allow a stochastic linear detector 204 to omit the steps of generating the samples of s' except for the first detector iteration, and thus lowering the complexity of the turbo equalization.

In the depicted embodiment, the sample generation module 404 includes a noise generation module 504, a fixed component module 506, and a random component module 508. The sample generation module 404 may generate a signal estimate s' using the fixed component module 506 to generate a fixed component of the signal estimate, and using the random component module 508 to generate a random component of the signal estimate based on noise generated by the noise generation module 504.

In some embodiments, a fixed component of a signal estimate s' is a quantized result of applying the estimator matrix W to the received signal vector y. In Eq. (20), we see that the stochastic samples s' can be represented by the combination of an estimate of $\hat{s}$ and many shaped noise samples, and the estimate $\hat{s} = Wy$ can be considered the center of a sampling distribution. Under some circumstances, it may be beneficial to replace the sampling center with something other than the linear estimate. One example may be to move the sampling center to a valid symbol location, i.e. applying a hard-decision to the soft linear estimate. For example, in some embodiments, the fixed component module 506 may quantize the product Wy to a valid QAM symbol (or another type bit symbol used if another form of modulation is in use).

In another embodiment, a fixed component of a signal estimate s' is based on or more signal estimates s' previously generated by the sample generation module 404. For example, the fixed component module 506 may adapt a fixed component or sampling center to $s_{center}=\text{argmin}\|y-Hs'\|^2$ as sampling is in progress. A further embodiment may be to use a solution suggested by the prior information as the sampling center.

Also, in some embodiments, at least two of the signal estimates s' generated by the sample generation module 404 may include two different fixed components. For example, the fixed component module 506 may provide multiple different fixed components or sampling centers to different signal estimates s' or subsets of the signal estimates s', with the different sampling centers potentially initialized through different means, to improve signal detection performance by adding diversity to the signal estimates.

The noise generation module 504, in certain embodiments, may generate noise used by the sample generation module 404 (e.g., by the random component module 508) to generate a signal estimate. The term generated noise as used herein, may refer to random values selected from a probability distribution, as described above. In one embodiment, the noise generation module 504 may generate noise randomly or pseudo-randomly. In another embodiment, the noise generation module 504 may receive generated noise from an external source, such as a component that physically generates random noise. In certain embodiments, the noise generation module 504 is configured to generate the noise based on a Gaussian probability distribution, as described above. In further embodiments, the noise generation module 504 is configured to generate or scale the noise so that a noise variance for the Gaussian probability distribution is based on a variance $\sigma^2_n$ for channel noise.

In certain embodiments, increasing the variance of the generated noise may produce more diverse signal estimates, increasing the accuracy of the soft information produced by the output module 406. However, excessive noise variance for the generated noise may make the sampling region too large, decreasing detector sampling efficiency. In some embodiments, the noise generation module 504 may provide upper and/or lower bounds to the noise variance of the generated noise.

In one embodiment, a variance for the generated noise may be greater than a channel noise variance. For example, the noise generation module 504 may scale the generated noise to produce a generated noise variance greater than the channel noise variance. (The symbol $\sigma^2_n$ may be used herein interchangeably for the generated noise variance or the channel noise variance, with the meaning clarified by context if the two variances are not equal).

In some embodiments, it may be beneficial to prevent the sampling noise variance from becoming too small and thereby reducing performance. For example, when operating in a high SNR regime, the sampling noise variance $\sigma^2_n$ may have to be adjusted in order to produce generated random samples ŝ+v' sufficiently spread apart, such that after quantizing to valid symbols they lead to a set of diverse samples of s'. At the same time, the variance should not be made too large or it may lead to generating samples of s' that are too far from the maximum likelihood solution $s_{ML}$, hence providing very little useful information for computation of LLR values.

Thus, in certain embodiments, a variance for the generated noise is based on an average column energy for a channel matrix. In one embodiment, the noise generation module 504 may select the generated noise variance such that the size of the elements of the generated random vectors v' is comparable with the spacing of the adjacent points in the lattice of valid QAM symbols as in $$\sigma_n^2 = \frac{\eta E(\|h_i\|^2)}{2N_r} \quad (38)$$

where $E(\|h_i\|^2)$ is the average column energy of H, $N_r$ is the number of receive antennas, and the extra factor $\eta$ is a scaling factor for tuning. In one embodiment the noise generation module 504 may use a scaling factor of $\eta=\frac{1}{2}$. In another embodiment, the noise generation module 504 may use another scaling factor which may be predetermined, empirically determined, or the like.

In some conditions, noise enhancement may negatively impact the performance of a stochastic linear detector. For example, when the channel matrix H is ill-conditioned and the channel noise variance $\sigma_n^2$ is small (for instance, in a channel environment with high SNR and highly correlated streams), the use of the gain matrix W for finding the center of the sampling of s' and noise shaping, i.e. to generate samples of v', may not be effective. The generated samples may incur a large level of noise enhancement (e.g., the shaped noise vectors Wn' may be widely distributed due to channel matrix H being nearly singular, and the resulting elements of W being large). This noise enhancement may lead to a poor set of signal estimates.

In certain embodiments, the effects of noise enhancement may be mitigated or reduced by using an estimator matrix W and/or a noise shaping matrix D based on a noise enhancement reduction parameter α. For example, the noise enhancement reduction module 502, in some embodiments, may initialize an estimator matrix W or a noise shaping matrix D to be the modified matrix $W=(H^TH+\alpha I)^{-1}H^T$, where a is a positive number larger than $\sigma_n^2/\sigma_s^2$ with larger values the noise enhancement reduction parameter α reducing the noise enhancement more strongly.

In further embodiments, the noise enhancement reduction parameter α may be based on an average column energy for a channel matrix. For example, one choice the noise enhancement reduction module 502 may use for α under such conditions may be $$\alpha = \frac{\eta E(\|h_i\|^2)}{2N_r\sigma_s^2} \quad (39)$$

where $E(\|h_i\|^2)$ is the average column energy of H, $N_r$ is the number of receive antennas, and the extra factor $\eta$ is a scaling factor for tuning. In one embodiment the noise enhancement reduction module 502 may use a scaling factor of $\eta=\frac{1}{2}$. In another embodiment, the noise enhancement reduction module 502 may use another scaling factor which may be predetermined, empirically determined or the like.

The random component module 508, in certain embodiments, may reduce the complexity for generation of signal estimates by the sample generation module 404, by reusing generated noise, or by shaping noise using subsets of the noise shaping matrix D.

One possible way to reduce or limit the computational complexity of obtaining samples of v' is by reducing the number of redundant samples and/or lowering the complexity of the computation of each sample. For example, when the random vectors of size $2N_r \times 1$ with independent Gaussian elements are generated, one can use each of these vectors for multiple samples of v' by changing the signs of a subset of the Gaussian elements. This reduces the number of independent multiplications required for generating the sample set s'. Furthermore, this method may lead to a more diverse set of samples of s' and, accordingly, may improve the detector performance.

As an example of reusing generated noise, in one embodiment, the random component module 508 may generate a first noise vector n', change signs of one or more components of the first noise vector n' to produce at least one modified noise vector, and the sample generation module 404 may generate signal estimates based on the first noise vector and the at least one modified noise vector. Reusing a generated noise vector n' with the signs of one or more elements flipped may produce signal estimates s' in a variety of directions from the sampling center, but with the noise still shaped by the noise shaping matrix D, and thus may increase detector performance with a small increase in complexity.

In another embodiment, as an example of shaping noise using subsets of the noise shaping matrix D, the random component module 508 may determine a random component of a signal estimate based on applying a subset of the noise shaping matrix D to generated noise without applying the full noise shaping matrix D to the generated noise.

One way to reduce the number of multiplications and additions used to generating each signal estimate by using a subset of the rows or columns of D instead of the full noise shaping matrix D. As shown in Eq. (20), one can solve for a single estimate $\hat{S}$ as the center of the stochastic sampling distribution and generate multiple shaped noise samples v'=Dn' to be used in producing the stochastic samples.

Next, we recognize that each row of D is only used to shape a single element of v', therefore one way to reduce the cost of each sample is to update only a subset of s' elements at a time by only using the corresponding rows of D to update a subset of the elements of v'. In various embodiments, a random component module 508 may use any subset of rows to generate each sample. In one embodiment, a random component module 508 may use one row at a time in a sequential, repeating fashion. Using one row at a time may be an easy way to assure that every element of s' is tested.

Now it should be clear that another embodiment of this general cost reduction idea is to only use a subset of the columns of D to generate each sample. Since fewer elements of s' will be used, it may be necessary to scale the noise variance to preserve the average energy of the generated v'. In various embodiments, a random component module 508 may use any subset of columns to generate each sample. In one embodiment, a random component module 508 may use one column at a time in a sequential, repeating fashion. Using one column at a time may be an easy way to assure that all noise shaping basis vectors of D are used.

In both the reduced row-space and reduced column-space methods described above, it was assumed that the stochastic samples are produced without memory, i.e. each stochastic sample is independent from the previous samples. Memory can be added to the row-space and column-space approaches by accumulating the changes in s' from multiple v' samples. Adding memory can improve performance. Additionally, the memory may be occasionally reset to prevent s' from moving too far away from the original sampling center. Therefore, in some embodiments, the sample generation module 404 may reset to the original center after every $v'_t$ element has been generated once.

Figure 6:
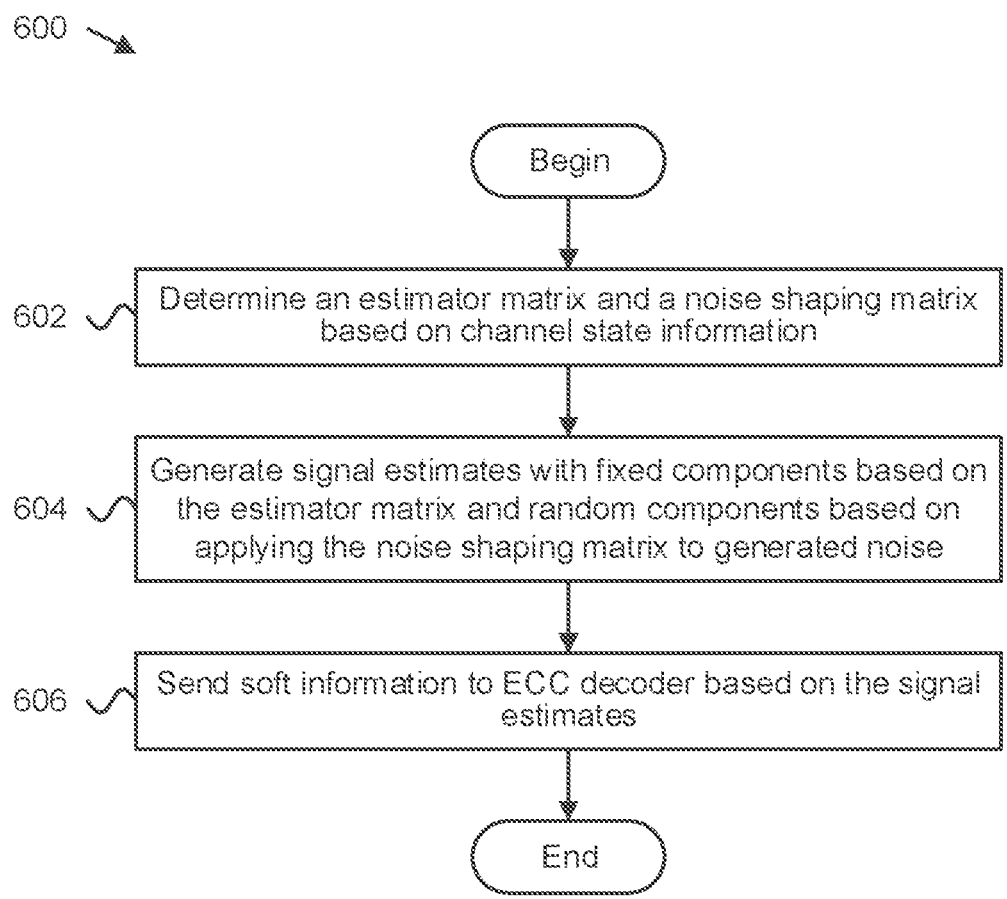
FIG. 6 is a schematic flow chart diagram illustrating one embodiment of a method for stochastic linear detection.

FIG. 6 is a schematic flow chart diagram illustrating one embodiment of a method 600 for stochastic linear detection. The method 600 begins, and an initialization module 402 determines 602 an estimator matrix and a noise shaping matrix based on channel state information that relates transmitted signals to received signals. A sample generation module 404 stochastically generates 604 a plurality of signal estimates such that each signal estimate is a sum of a fixed component and a random component. The fixed component may be based on applying the estimator matrix to a vector of the received signals, and the random component may be based on applying the noise shaping matrix to generated noise. An output module 406 sends 606 soft information to an error-correcting code ECC decoder for decoding bits carried by the transmitted signal, and the method 600 ends. The soft information is based on the plurality of signal estimates.

Figure 7:
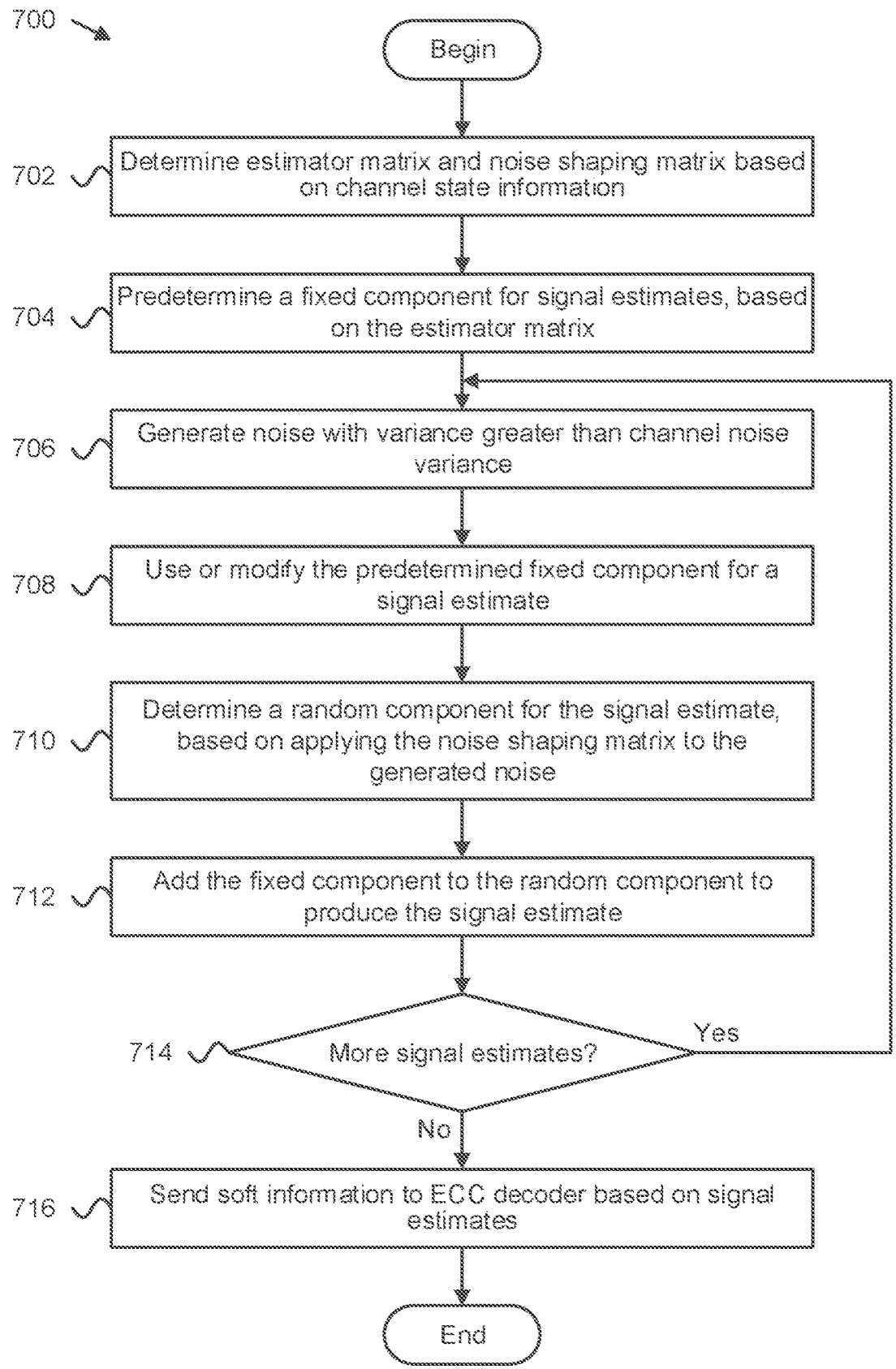
FIG. 7 is a schematic flow chart diagram illustrating another embodiment of a method for stochastic linear detection.

FIG. 7 is a schematic flow chart diagram illustrating another embodiment of a method for stochastic linear detection. The method 700 begins, and an initialization module 402 determines 702 an estimator matrix and a noise shaping matrix based on channel state information that relates transmitted signals to received signals. A sample generation module 404 predetermines 704 a fixed component for signal estimates based on the estimator matrix. An iteration of the sample generation module 404 for generating a signal estimate begins, and the noise generation module 504 generates 706 noise with a greater variance than the channel variance. The fixed component module 506 uses or modifies 708 the predetermined fixed component. For example, the fixed component module 506 may reference the predetermined fixed component if the predetermined fixed component is to be used "as is" as a component of a signal estimate in the current iteration. Or, the fixed component module 506 may modify the predetermined fixed component for use in the current iteration (and possibly, for future iterations). Modifying the fixed component may include quantization, applying a shift based on one or more signal estimates generated in prior iterations, or the like.

The random component module 508 determines 710 a random component for the signal estimate in the current iteration, based on based on applying the noise shaping matrix to the generated noise. The sample generation module 404 adds 712 the fixed component from the fixed component module 506 to the random component from the random component module 508 to produce the signal estimate for the current iteration.

The sample generation module 404 determines 714 whether to produce additional signal estimates in additional iterations. Determining whether to produce additional signal estimates may include determining whether a predetermined number of signal estimates have been generated, determining whether soft information from the output module 406 is likely to change (beyond a threshold level of change) with additional signal estimates, or the like. If the sample generation module 404 determines 714 to produce additional signal estimates, the noise generation module 504 generates 706 noise as described above, and the method 700 continues in another iteration of the sample generation module 404 for generating a signal estimate.

If the sample generation module 404 determines 714 not to produce additional signal estimates, the output module 406 sends 716 soft information to an error-correcting code ECC decoder for decoding bits carried by the transmitted signal, and the method 700 ends. The soft information is based on the plurality of signal estimates.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
    a digital signal processor configured to determine information about a plurality of transmitted signals based on a plurality of received signals, the digital signal processor comprising:
        an initialization module configured to determine an estimator matrix and a noise shaping matrix based on channel state information that relates the transmitted signals to the received signals;
        a sample generation module configured to stochastically generate a plurality of signal estimates such that each signal estimate is a sum of a fixed component and a random component, the fixed component based on applying the estimator matrix to a vector of the received signals, and the random component based on applying the noise shaping matrix to generated noise; and
        an output module configured to send soft information to an error-correcting code (ECC) decoder for decoding bits carried by the transmitted signals, the soft information based on the plurality of signal estimates,
        wherein the initialization module, the sample generation module, and the output module comprise one or more of hardware circuits, programmable hardware circuits and executable code, the executable code stored on one or more computer readable storage media.

2. The apparatus of claim 1, wherein the sample generation module is configured to stochastically generate a signal estimate by determining the fixed component, generating the noise based on a Gaussian probability distribution, applying the noise shaping matrix to the generated noise to determine the random component, and adding the random component to the fixed component.

3. The apparatus of claim 1, wherein the noise shaping matrix is equal to the estimator matrix, and the sample generation module is configured to stochastically generate a signal estimate by generating the noise based on a Gaussian probability distribution, adding the noise to the vector of received signals, and applying the noise shaping matrix to the sum of the noise and the vector of received signals.

4. The apparatus of claim 1, wherein the noise shaping matrix is not equal to the estimator matrix.

5. The apparatus of claim 1, wherein a variance for the generated noise is greater than a channel noise variance.

6. The apparatus of claim 1, wherein a variance for the generated noise is based on an average column energy for a channel matrix.

7. The apparatus of claim 1, wherein one or more of the estimator matrix and the noise shaping matrix are based on a noise enhancement reduction parameter.

8. The apparatus of claim 7, wherein the noise enhancement reduction parameter is based on an average column energy for a channel matrix.

9. The apparatus of claim 1, wherein one or more of the estimator matrix and the noise shaping matrix is based on soft information from the ECC decoder.

10. The apparatus of claim 1, wherein a fixed component of a signal estimate is a quantized result of applying the estimator matrix to the vector of the received signals.

11. The apparatus of claim 1, wherein a fixed component of a signal estimate is based on or more signal estimates previously generated by the sample generation module.

12. The apparatus of claim 1, wherein at least two of the signal estimates comprise two different fixed components.

13. The apparatus of claim 1, wherein the sample generation module is configured to generate a first noise vector, change signs of one or more components of the first noise vector to produce at least one modified noise vector, and generate signal estimates based on the first noise vector and the at least one modified noise vector.

14. The apparatus of claim 1, wherein a random component of a signal estimate is based on applying a subset of the noise shaping matrix to generated noise without applying the full noise shaping matrix to the generated noise.

15. A system comprising:
    a plurality of receive antennas that receive a plurality of signals; and
    digital signal processing circuitry that determines information about a plurality of transmitted signals based on the plurality of received signals, wherein the digital signal processing circuitry:
        determines an estimator matrix and a noise shaping matrix based on channel state information that relates the transmitted signals to the received signals;
        stochastically generates a plurality of signal estimates such that each signal estimate is a sum of a fixed component and a random component, the fixed component based on applying the estimator matrix to a vector of the received signals, and the random component based on applying the noise shaping matrix to generated noise; and
        sends soft information to an error-correcting code (ECC) decoder for decoding bits carried by the transmitted signals, the soft information based on the plurality of signal estimates.

16. The system of claim 15, wherein the digital signal processing circuitry stochastically generates a signal estimate by determining the fixed component, generating the noise based on a Gaussian probability distribution, applying the noise shaping matrix to the generated noise to determine the random component, and adding the random component to the fixed component.

17. The system of claim 15, wherein the digital signal processing circuitry generates the noise such that a variance for the generated noise is greater than a channel noise variance.

18. A method comprising:
    determining an estimator matrix and a noise shaping matrix based on channel state information that relates a plurality of transmitted signals to a plurality of received signals;
    stochastically generating a plurality of signal estimates such that each signal estimate is a sum of a fixed component and a random component, the fixed component based on applying the estimator matrix to a vector of the received signals, and the random component based on applying the noise shaping matrix to generated noise; and sending soft information to an error-correcting code (ECC) decoder for decoding bits carried by the transmitted signals, the soft information based on the plurality of signal estimates.

19. The method of claim 18, wherein stochastically generating a signal estimate comprises determining the fixed component, generating the noise based on a Gaussian probability distribution, applying the noise shaping matrix to the generated noise to determine the random component, and adding the random component to the fixed component.

20. The method of claim 18, further comprising generating the noise such that a variance for the generated noise is greater than a channel noise variance.

* * * * *